(12) United States Patent
Yamazaki et al.

(10) Patent No.: US 6,903,916 B2
(45) Date of Patent: *Jun. 7, 2005

(54) ROLL OF LAMINATE FOR CAPACITOR LAYER FOR WITHSTAND VOLTAGE INSPECTION AND METHOD OF WITHSTAND VOLTAGE MEASUREMENT USING THIS ROLL OF LAMINATE FOR CAPACITOR LAYER FOR WITHSTAND VOLTAGE INSPECTION

(75) Inventors: Kazuhiro Yamazaki, Ageo (JP); Takashi Syoujiguchi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 78 days.

This patent is subject to a terminal disclaimer.

(21) Appl. No.: 10/717,639

(22) Filed: Nov. 21, 2003

(65) Prior Publication Data

US 2004/0120098 A1 Jun. 24, 2004

(30) Foreign Application Priority Data

Dec. 20, 2002 (JP) ..................................... P2002-369533

(51) Int. Cl.$^7$ ................................................. H01G 4/30
(52) U.S. Cl. ............................... 361/301.4; 361/301.1; 361/303; 361/309; 361/273; 361/304
(58) Field of Search .......................... 361/301.4, 301.5, 361/301.1, 303, 304, 305, 309, 306.1, 323, 314, 315, 273, 308.1, 308.2

(56) References Cited

U.S. PATENT DOCUMENTS

| 4,345,298 A | * | 8/1982 | Grahame ..................... 361/273 |
| 4,603,373 A | * | 7/1986 | Lavene ..................... 361/306.1 |
| 4,889,536 A | * | 12/1989 | Naitoh et al. ............... 29/25.03 |
| 6,114,015 A | | 9/2000 | Fillion et al. |
| 6,306,509 B2 | * | 10/2001 | Takeuchi et al. ......... 428/425.8 |
| 6,388,865 B1 | * | 5/2002 | Honda et al. ................ 361/311 |

FOREIGN PATENT DOCUMENTS

JP             5229059            9/1993

* cited by examiner

Primary Examiner—Dean A. Reichard
Assistant Examiner—Nguyen T. Ha
(74) Attorney, Agent, or Firm—Rothwell Figg Ernst & Manbeck

(57) ABSTRACT

The present invention provides a technique which permits the withstand voltage measurement of a laminate web for capacitor layer manufactured by a continuous laminating method in a roll state wound around a core tube. The invention provides a roll of laminate for capacitor layer which is obtained by manufacturing a laminate web for capacitor layer by laminating a first electrically conductive layer, a dielectric layer and a second electrically conductive layer and winding this laminate web for capacitor layer from a start end side to a terminal end side thereof around a core tube. In the laminate web for capacitor layer 1a to be wound around the core tube 2, the in-plane laminating arrangement of the first electrically conductive layer 3, the second electrically conductive layer 5 and the dielectric layer 4 is contrived, and by superposing an insulating resin film F on one side of this laminate web for capacitor layer and simultaneously winding this insulating resin film to make the laminate web for capacitor layer in a roll state, whereby a roll of laminate web for capacitor layer for withstand voltage inspection in which electrical insulation between layers overlapping each other is formed. The invention also provides a method of performing withstand voltage inspection which involves partially removing interlayer dielectric means of the laminate web for capacitor layer 1a positioned in the periphery of the roll of laminate web for withstand voltage inspection and performing the inspection using the exposed first and second electrically conductive layers.

10 Claims, 11 Drawing Sheets

(a)

Cutting of ends (b)

ROLL OF LAMINATE FOR CAPACITOR LAYER FOR WITHSTAND VOLTAGE INSPECTION AND METHOD OF WITHSTAND VOLTAGE MEASUREMENT USING THIS ROLL OF LAMINATE FOR CAPACITOR LAYER FOR WITHSTAND VOLTAGE INSPECTION

BACKGROUND OF THE INVENTION

1. Field of the Invention

The present invention relates to a roll of laminate for capacitor layer for withstand voltage inspection and a method of measuring withstand voltage using this roll of laminate for capacitor layer for withstand voltage inspection.

2. Description of the Related Art

A laminate in which electrically conductive layers are disposed on both sides and a dielectric layer is provided between the electrically conductive layers like a laminate related to the present invention has thitherto been widely used as a basic material for forming a capacitor layer, mainly, of a printed wiring board. This material for forming a capacitor layer is what is called a double-sided clad laminate and has been manufactured by disposing copper laminate on both sides of a dielectric layer component material, such as a prepreg in which a semicuring resin constituting a dielectric layer is impregnated in glass cloth etc. and a semicuring resin sheet, and hot pressing the copper laminate.

In such a manufacturing method as described above, a manufacturing method of a copper clad laminate used in the fabrication of conventional printed wiring boards is used as it is, and it has been general practice to adopt a manufacturing method which, for example, involves disposing a plurality of daylights between a set of hot press plates for press forming, laminating metal foil and a dielectric layer component material between the daylights so as to form a plurality of double-sided laminates, superposing these materials in multiple layers, and bonding these materials together by hot pressing. During this press working, pressing conditions are set so that the semicuring resin of the dielectric layer component material starts reflow and flows out over a fixed distance from an end of the laminate. This is necessary from the viewpoint of promoting the action of an air vent present between an aggregate material such as a glass cloth and an impregnated resin, improving the wettability between the bonded surface of the metal foil and the resin and increasing the bonding strength between the metal foil and the dielectric layer.

Under such a method as described above, a schematic view as shown in FIG. 10(A) is obtained when a section of a double-sided laminate immediately after hot press working is observed. Ends of this double-sided clad laminate 10 are cut by a shearing cutter etc. after that and a double-sided copper laminate as a product is completed.

However, if end treatment as described above is performed for a double-sided clad laminate having a thin dielectric layer as used in the formation of a capacity layer, it follows that the phenomenon described very schematically below by referring to drawings occurs. The double-sided clad laminate in the state obtained by press working is shown in FIG. 10(A). When the end portions of this double-sided clad laminate are cut from up to down by means of edges 11 of a shearing cutter, particularly in a case where the metal material is a soft material, such as copper, this phenomenon is remarkable. That is, top side metal foil 12 is elongated and stretched toward bottom side metal foil 13 in association with the movement of the edges 11 of the shearing cutter and the leading end portions of the top side metal foil 12 come into contact with the bottom side metal foil 13. This is the state shown in FIG. 10(B).

In such a state, the electrically conductive layers on both sides form short circuits, with the result that even when the interlayer withstand voltage of a double-sided clad laminate used in the formation of a capacity layer is to be measured, the measurement becomes impossible in this state. Therefore, it becomes impossible for clad laminate makers to perform complete quality assurance because they cannot check interlayer resistance as a double-sided clad laminate for the formation of a capacity layer.

It is also possible to conceive that if such a state as shown in FIG. 10(B) is generated, the end portions of a double-sided clad laminate after the cutting thereof by use of a shearing cutter are polished by polishing means, such as a grinder, to produce good end surfaces. However, in the case of a double-sided laminate used for the formation of a capacity layer, a problem as described below arises even when good end surfaces are produced.

That is, a thin dielectric layer is common to double-sided clad laminates used for the formation of a capacity layer. Particularly in recent years, even double-sided clad laminates having a dielectric layer which is as thin as 20 μm or so have been manufactured. When a double-sided clad laminate has such a thin dielectric layer 4 and electrically conductive layers of metal foil 12, 13 are present up to the end portions of the laminate, the discharge phenomenon occurs at the edge portions of the electrically conductive layer on both sides between the end portions of the laminate, which are indicated by an arrow m FIG. 11, and it becomes almost impossible to accurately measure withstand voltage. In particular, the interlayer withstand voltage test of a double-sided clad laminate used for the formation of a capacity layer is conducted by applying a high voltage of not less than 500 V and hence the discharge phenomenon in the electrically conductive layers at the end portions of the laminate is apt to occur.

In order to solve such a problem as described above, the present inventors provided, in Patent Literature 1 (Japanese Patent Application No. 2002-157067), a double-sided clad laminate which enables the interlayer withstand voltage of a double-sided clad laminate used in the formation of a capacity layer to be measured in a simpler manner in the state of the double-sided clad laminate and which can supply a quality assured product and a method of manufacturing this double-sided clad laminate.

The invention disclosed by the present inventors in Patent Literature 1 is based on the use of "a double-sided copper clad laminate for the formation of a capacity layer in which copper foil is clad to both sides of a dielectric layer, wherein the copper foil shape on both sides of the double-sided copper clad laminate is in an analogous relation, with the size of first copper foil on one side being smaller than that of second copper foil on the other side, the first copper foil and the second copper foil being disposed concentrically via the dielectric layer, and wherein a peripheral portion of an edge end of the side of the double-sided copper clad laminate to which the first copper foil is clad has a dielectric region in which the dielectric layer is exposed," and withstand voltage inspection is performed for each lamination of what is called a double-sided copper clad laminate.

However, a laminate for capacitor layer related to the present invention is a laminate web for capacitor layer fabricated by sequentially laminating a first electrically conductive layer formed from a metal foil laminate, a dielectric layer and a second electrically conductive layer formed from a metal foil web and bonding the these layers in a laminated state into one piece. In fabricating this laminate web for capacitor layer, it is possible to adopt several continuous laminating methods, such as a method by which continuous laminate forming is performed using two metal foil webs and a film material constituting a dielectric layer, and a method by which continuous laminate forming is performed, with the dielectric layer sides of two dielectric-layer-formed metal foil webs opposed to each other.

It is a laminate web for capacitor layer that is obtained by a continuous laminating method in this manner. Winding this laminate web for capacitor layer around a core tube in a rolled state is desirable from the standpoint of raising the production efficiency and besides this is also desirable in terms of safety during product transportation and less storage space.

When a laminate web for capacitor layer manufactured by this continuous laminating method is used, it is used after being cut to an arbitrary size. Therefore, in this laminate web for capacitor layer which has been cut, various problems as shown in FIG. 10(B) arise and the application of the invention disclosed in Patent Literature 1 becomes difficult.

In the continuous laminating method, techniques which permit withstand voltage measurement in a rolled state have been desired in order to supply to the market products in which the production efficiency of laminates for capacitor layer is high and which are more inexpensive.

SUMMARY OF THE INVENTION

Hence, the present inventors have devoted themselves to earnest research and, as a result, made the invention which will be described below by regarding problems to be considered to form a laminate web for capacitor layer in a roll state and to perform withstand voltage measurement for each roll as "[1] a problem in the laminate web for capacitor layer itself, that is, withstand voltage measurement cannot be performed owing to the shape of the laminate web for capacitor layer itself if the start end side and terminal end side of the laminate web for capacitor layer to be spliced to the core tube are kept in a state as shown in FIG. 6(A) or FIG. 7" and "[2] in splicing a laminate web for capacitor layer to a core tube and winding the laminate web for capacitor layer around the core tube in a roll state, ensuring an electrical insulation condition between areas of the laminate web for capacitor layer which overlap each other when the laminate web for capacitor layer is wound in a roll state." In a withstand voltage inspection roll of a laminate for capacitor layer related to the present invention, it is possible to adopt various variations in addition to the variations which will be shown below. Descriptions will be given below for each of the variations. However, the present inventors consider that the technical philosophy involved in these variations can involve all technical philosophies required by other variations.

<First Variation>

A first roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the first electrically conductive layer having a prescribed size," "a metal foil web which forms the second electrically conductive layer having the same size as the first electrically conductive layer," and "a dielectric layer having a size which is longer by not less than 4 nm in full length than the size of the metal foil webs of the first electrically conductive layer and the second electrically conductive layer" and bonding these layers in a laminated state, the first electrically conductive layer and the second electrically conductive layer being disposed so as to be in a symmetric position via the dielectric layer, the end face position of the two electrically conductive layers on the start end side and the terminal end side being the same, and the dielectric layer positioned between the first electrically conductive layer and the second electrically conductive layer protruding by not less than 2 mm from the start end side and terminal end side of the first electrically conductive layer and the second electrically conductive layer, and wherein by providing interlayer dielectric means on one side of this laminate web for capacitor layer, an electrical insulation condition is formed between areas of the laminate web for capacitor layer which overlap each other when the laminate web for capacitor layer is wound in a roll state."

FIGS. 1(A) to 1(C) schematically show the concept of winding this roll of laminate for capacitor layer 1*a* for withstand voltage inspection around a core tube 2. The "laminate web for capacitor layer" which is to be spliced to the core tube 2 and wound around the core tube, shown as an enlarged view in FIG. 1(B), will be described. This laminate web for capacitor layer 1*a* has a three-layer construction of a first electrically conductive layer 3/*a* dielectric layer 4/*a* second electrically conductive layer 5. In the present invention, the sizes of these layers provide a very important element, which determines the shape of the laminate web for capacitor layer 1*a* to be wound around the core tube 2. FIGS. 1(A) to 1(C) schematically show cases where the layer construction of the laminate web for capacitor layer 1*a* is viewed in the three directions of (A), (B) and (C). Because these figures show the layer construction so that it can be clearly grasped, the thicknesses of each layer in the figures do not accurately reflect those of an actual product. FIG. 1(A) is a top surface view to grasp the concept of winding the laminate web for capacitor layer around the core tube, FIG. 1(B) is a side view of the flow direction to grasp the side layer construction of the laminate web for capacitor layer in the flow direction as viewed from the side, and FIG. 1(C) is a transverse direction side view to grasp the side layer construction of the laminate web for capacitor layer in the transverse direction. Incidentally, in the enlarged view shown in FIG. 1(B) according to need, the description of interlayer dielectric means such as an insulating resin film F is omitted. The above descriptions of FIGS. 1(A) to 1(C) are the same as in other FIGS. 2(A) to 2(C) to FIGS. 7(A) to 7(C) and, therefore, detailed descriptions of the contents of FIGS. 2(A) to 2(C) to FIGS. 7(A) to 7(C) will be omitted below.

Laminate web for capacitor layer: In the first variation are used "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length than the size of the metal foil webs of the first electrically conductive layer and the second electrically conductive layer." First, in the first electrically conductive layer 3 and the second electrically conductive layer 5 is used electrically conductive metal foil, such as copper foil, copper alloy foil, nickel foil and nickel alloy foil, which becomes as a metal foil web either of an upper electrode or a lower electrode in a metal foil web when a capacitor circuit is mainly formed. As can be comprehensively judged from the three drawings of FIGS. 1(A), 1(B) and 1(C), the first electrically conductive layer 3 and the second electrically conductive layer 5 are in symmetric positions via the dielectric layer 4. Disposition in symmetric positions means that the end face positions of the two electrically conductive layers 3, 5 at the start end side S and the terminal end side E are the same. This word "the same" does not mean the complete same or the absolute same and refers to the same in a mean which contains certain errors in technical common sense and the meaning of the term "the same" used in this specification should always be similarly construed. In the first variation, the size of the first electrically conductive layer 3 and the second electrically conductive layer 5 is the same, with the result that the positions of the lateral end sides Sd1, Sd2 along the winding-up direction of the first electrically conductive layer 3 and the second electrically conductive layer 5 also become the same.

The dielectric layer 4 used here has a size which is longer by not less than 4 mm in full length than the size of the metal foil webs of the first electrically conductive layer 3 and the second electrically conductive layer 5. As a result, as is clearly apparent from the enlarged view of FIG. 1(B), it is possible to dispose the dielectric layer 4 positioned between the first electrically conductive layer 3 and the second electrically conductive layer 5 in such a manner that the distance corresponding to D1 protrudes by not less than 2 mm from the start end sides S and terminal end side E of the first electrically conductive layer 3 and the second electrically conductive layer 5. Therefore, by causing the dielectric layer 4 to protrude like this at the start end side S and the terminal end side E, it is possible to effectively prevent the contact between the first electrically conductive layer 3 and the second electrically conductive layer 5 and discharge at the end portions during withstand voltage inspection as described in FIG. 10(B) and FIG. 11.

The dielectric layer 4 called here is important for determining capacitance as a capacitor when a capacitor circuit is formed and it is preferred that the dielectric layer 4 be formed from a component material of high dielectric constant and have a thinner thickness. By adopting a manufacturing method of a laminate web for capacitor layer 1a related to the present invention as described next, this dielectric layer 4 is formed as a result of this. That is, [1] a laminate web for capacitor layer 1a related to the present invention is obtained by sandwiching a dielectric film between the first electrically conductive layer 3 and the second electrically conductive layer 5 so that the dielectric film protrudes by not less than 2 mm at the start end side S and the terminal end side E and continuously laminating the materials. [2] A dielectric layer is formed beforehand on the lamination surface of either or both of the first electrically conductive layer 3 and the second electrically conductive layer 5 (hereinafter such metal foil is referred to as "dielectric-layer-formed metal foil"), and they are continuously laminated and a laminate web for capacitor layer having a three-layer construction of the first electrically conductive layer 3/the dielectric layer 4/the second electrically conductive layer 5 may be used. In the latter case, by further exfoliating the first electrically conductive layer 3 and the second electrically conductive layer 5 on the start end side S and the terminal end side E in band shape in the transverse direction, it is possible to obtain a laminate web for capacitor layer 1a related to the present invention It is possible to use various types of resins, such as epoxy resins and polyimide resins, as a component resin of the dielectric layer 4. Organic materials such as various types of resins, metal oxides and inorganic materials such as meal hydroxides can be used depending on uses so long as they have given dielectric characteristics.

In a case where a dielectric filler is caused to be contained in the dielectric layer by use of organic materials, the component resin of the dielectric layer is used as a binder resin, a dielectric-filler-containing resin solution is produced by causing the dielectric filler to be contained in this binder resin, and the inductive layer is formed by uniformly applying this dielectric-filler-containing resin solution to the surface of the metal foil thereby to form dielectric-layer-formed metal foil.

Dielectric powders of conjugated oxides having the perovskite structure, such as $BaTiO_3$, $SrTiO_3$, $Pb(Zr—Ti)O_3$ (commonly called PZT), $PbLaTiO_3.PbLaZrO$ (commonly called PLZT) and $SrBi_2Ta_2O_9$ (commonly called SBT), and other ferroelectric ceramic powders can be used in this dielectric filler.

However, it is preferred that the dielectric filler have powder characteristics as described below. First, it is necessary that the particle diameter of the dielectric filler which is a powder be in the range of 0.05 to 1.0 $\mu$m. The "particle diameter" called here refers to an average particle diameter which is obtained by directly observing the dielectric filler under a scanning electron microscope (SEM) and by performing an image analysis of an SEM image of the dielectric filler, because powder particles form a certain secondary coagulating state, with the result that it is impossible to adopt indirect measurement which involves, for example, estimating an average particle diameter from measured values obtained by the laser diffraction scattering type particle diameter diffusion measuring method and the BET method because of low accuracy. In the present specification, the particle diameter at this time is expressed as $D_{IA}$. Incidentally, in the image analysis of powders of dielectric filler observed under a scanning electron microscope (SEM) in the present specification, a round particle analysis was performed on the basis of a roundness threshold value of 10 and a degree of overlap of 20 by use of IP-1000PC made by Asahi Engineering Co., Ltd. and the average particle diameter $D_{IA}$ was found.

Furthermore, it is required that the dielectric filler be a dielectric powder having a roughly spherical shape whose weight-cumulative particle diameter $D_{50}$ by the laser diffraction scattering type particle diameter diffusion measuring method is 0.1 to 2.0 $\mu$m and whose degree of aggregation expressed by $D_{50}/D_{IA}$, by use of the weight-cumulative particle diameter $D_{50}$ and the average particle diameter $D_{IA}$ obtained by an image analysis is not more than 4.5.

The "weight-cumulative particle diameter $D_{50}$ by the laser diffraction scattering type particle diameter diffusion measuring method" refers to a particle diameter at a weight accumulation of 50% obtained by the laser diffraction scattering type particle diameter diffusion measuring method. The smaller the value of this weight-cumulative particle diameter $D_{50}$, the higher the ratio of fine powder particles in the particle diameter distribution of dielectric filler powder. In the present invention, it is required that this value be 0.1

μm to 2.0 μm. That is, at a value of weight-cumulative particle diameter $D_{50}$ of less than 0.1 μm, no matter what manufacturing method is adopted in making a dielectric filler powder, the progress of aggregation is remarkable and the degree of aggregation will not satisfy the degree of aggregation, which will be described below. On the other hand, when the value of weight-cumulative particle diameter $D_{50}$ exceeds 2.0 μm, it becomes impossible to use the dielectric layer as a dielectric filler for the formation of a built-in capacitor layer of a printed wiring board That is, the dielectric layer of a double-sided copper clad laminate used for the formation of a built-in capacitor layer usually has a thickness of 10 μm to 25 μm and in order to uniformly disperse the dielectric filler in the dielectric layer, the upper limit of the dielectric layer thickness is 2.0 μm.

The measurement of the weight-cumulative particle diameter $D_{50}$ in the present invention was performed by mixing and dispersing a dielectric filler powder in methyl ethyl ketone and putting this solution into a circulator of a laser diffraction scattering type particle diameter distribution measuring device Micro Trac HRA Type 9320-X100 (made by Nikkiso Co., Ltd.).

The concept of the degree of aggregation used here was adopted for the reason described below. That is, it might be thought that the value of the weight-cumulative particle diameter $D_{50}$, which is obtained by the laser diffraction scattering type particle diameter distribution measuring method is not a result of an actual direct observation of the diameter of each powder particle. This is because powder particles which constitute almost all dielectric powders are not what is called an isolated dispersed power, in which individual particles are completely separated, and are in a state in which multiple powder particles aggregate and coalesce. And this is because it might be thought that in the laser diffraction scattering type particle diameter distribution measuring method, the weight-cumulative particle diameter is calculated by regarding powder particles which coalesce as one particle (an aggregated particle).

In contrast, because the average particle diameter $D_{IA}$ obtained by an image processing of an observation image of a dielectric powder observed under a scanning electron microscope is obtained directly from the SEM observation image, primary particles are positively caught but on the other hand, the presence of the aggregation state of powder particles is not reflected in the least.

On the basis of the above conception, the present inventors have decided to regard the value calculated as $D_{50}/D_{IA}$ by use of the weight-cumulative particle diameter $D_{50}$ by the laser diffraction scattering type particle diameter distribution method and the average particle diameter $D_{IA}$ obtained by an image analysis as the degree of aggregation. That is, on the assumption that the value of $D_{50}$ and that of $D_{IA}$ can be measured with the same accuracy in copper powders of the same lot, it might be thought, on the basis of the above theory, that the value of $D_{50}$ which reflects the fact that the aggregation state exists in measured values becomes larger than that of $D_{IA}$ (similar effects are obtained also in actual measurement).

If at this time, the aggregation state of the powder particles of the dielectric filler powder goes out of existence completely, the value of $D_{50}$ approximates the value of $D_{IA}$ limitlessly and it follows that the value of $D_{50}/D_{IA}$, which is the degree of aggregation, approximates 1. At the stage at which the degree of aggregation has become 1, it can be said that the pertinent particle powder is an isolated dispersed power completely free form the aggregation state of the particle powder. In actuality, however, there are also cases where the degree of aggregation shows a value of less than 1.

Theoretically speaking, in the case of a true sphere, the degree of aggregation does not become a value of less than 1. In actuality, however, it seems that values of degree of aggregation of less than 1 are obtained because powder particles are not true spheres.

In the present invention, it is required that the degree of aggregation of this dielectric filler powder be not more than 4.5. If the degree of aggregation exceeds 4.5, the level of aggregation of the powder particles of the dielectric filler becomes too high and it becomes difficult to uniformly mix the dielectric filler with the binder resin.

Even when any of the manufacturing methods, such as the alkoxide method, the hydrothermal synthesis method and the oxalate method, is adopted as a method of manufacturing a dielectric filler powder, the state of a certain aggregation is inevitably formed and, therefore, there is a possibility that a dielectric filler powder which does not satisfy the above-described degree of aggregation may be generated. Particularly in the case of the hydrothermal synthesis method, which is a wet process, the formation of the state of aggregation tends to occur. Therefore, by performing the particle dissociation treatment which involves separating the powder in this aggregation state into individual powder particles, it is possible to bring the aggregation state of the dielectric filler powder into the above-described range of the degree of aggregation.

If the purpose is only performing the particle dissociation work, it is possible to use various devices, such as a high-energy ball mill, a high-speed conductor collision type airstream grinder, an impact grinder, a gauge mill, a medium stirring type mill and a high water pressure grinder, as means capable of performing particle dissociation. However, in order to obtain the mixability and dispersibility of the dielectric filler powder and binder resin, it is necessary to consider a reduction in viscosity as a dielectric-filler-containing resin solution as will be described below. In reducing the viscosity of a dielectric-filler-containing resin solution, it is required that the specific surface area of the powder particles of the dielectric filler and the surface of the powder particles be smooth. Therefore, a particle dissociation technique to be adopted should not be such that even when particle dissociation is possible, the surfaces of the powder particles are damaged during particle dissociation, thereby increasing the specific surface area of the powder particles.

The present inventors devoted themselves to earnest research on the basis of such recognition and, as a result, found that two techniques are effective. What is common to these two techniques is that particle dissociation is made quite possible by minimizing the contact of the powder particles of the powder of the dielectric filler with the inside wall part and stirring blade of the device and the grinding medium, etc. and by causing the powder particles which have aggregated to collide with each other. That is, the contact of the powder particles of the powder of the dielectric filler with the inside wall part and stirring blade of the device and the grinding medium, etc. results in damaged surfaces of the powder particles, increased surface roughness and a lowered sphericity and hence this is to be prevented. And by causing powder particles to collide with each other sufficiently, the powder particles in the aggregation state are dissociated and, at the same time, the surfaces of the powder particles are made smooth by the collision of the powder particles with each other. Techniques which permit the foregoing can be adopted.

In one technique, a dielectric filler powder in the aggregation state is subjected to particle dissociation treatment by use of a jet mill. The "jet mill" called here refers to a device which uses a high-velocity airstream, puts the dielectric filler powder in this airstream, and performs the particle dissociation work by causing powder particles to collide with each other in this high-velocity airstream.

In the other technique, slurry which is obtained by dispersing a dielectric filler powder in the aggregation state in a solvent which does not collapse the stoichiometry of this dielectric filler powder is subjected to particle dissociation treatment by use of a fluid mill which utilizes a centrifugal force. By using the "fluid mill which utilizes a centrifugal force" called here, the relevant slurry is caused to flow at a high velocity so as to describe a circumferential trajectory, powder particles which have aggregated are caused to collapse with each other in a solvent by use of the centrifugal force generated at this time thereby to perform the particle dissociation work. As a result of this, by cleaning, filtering and drying the slurry for which the particle dissociation work has been completed, a dielectric filler powder for which the particle dissociation work has been completed is obtained. By using the above-described methods it is possible to adjust the degree of aggregation and to smooth the powder surface of the dielectric filler powder.

A dielectric-filler-containing resin for the formation of a dielectric layer is obtained by mixing the above-described binder resin and dielectric filler with each other. For the blending ratio of the binder resin and dielectric filler, it is desirable that the dielectric filler content be 75% by weight to 85% by weight, the balance being the binder resin.

When the dielectric filler content is less than 75% by weight, the dielectric constant of 20 which is at present requited in the market cannot be satisfied. When the dielectric filler content exceeds 85% by weight, the binder resin content becomes less than 15% by weight and the adhesion between the dielectric-filler-containing resin and the metal foil to be clad to this resin is impaired, with the result that it becomes difficult to manufacture a laminate which satisfies the properties required by the manufacturing of printed wiring boards.

When the manufacturing accuracy of this dielectric filler as a powder in the current stage is considered, it is desirable to use barium titanate among conjugated oxides having the perovskite structure. In this case, either calcined barium titanate or uncalcined barium titanium can be used as the dielectric filler. Although it is desirable to use calcined barium titanate when a high permittivity is to be obtained, a selection may be made according to the design quality of a printed circuit board product.

Furthermore, it is most preferred that the dielectric filler of barium titanate have a cubic system crystal structure. Although a cubic system and a tetragonal system exist as the crystal structures of barium titanate, the dielectric filler of barium titanium having the cubic system provides a more stable value of permittivity of a finally obtained dielectric layer than in a case where the dielectric filler of barium titanium having the tetragonal system alone is used. Therefore, it can be said that it is necessary to use at least a barium titanium powder having crystal structures of both the cubic system and the tetragonal system.

An excellent product is obtained when the laminate web for capacitor layer 1a related to the present invention is manufactured by working the above-described dielectric-filler-containing resin into a dielectric film or by forming a dielectric layer on a metal foil surface using the dielectric-filler-containing resin to produce dielectric-layer-formed metal foil. When such a manufacturing method as described above is adopted, it is possible to freely select the thickness of the dielectric layer of the laminate web for capacitor layer 1a, with the result that high capacitor quality with excellent capacitance can be obtained.

The laminate web for capacitor layer 1a to be wound around the core tube 2 will be understood from the above descriptions. Because the contact between the first electrically conductive layer 3 and the second electrically conductive layer 5 and the occurrence of discharge at end portions can be prevented by obtaining the laminate web for capacitor layer 1a having such a construction, it is possible to perform quality assurance related to withstand voltage along the full length of the laminate web for capacitor layer 1a by pressing probes for withstand voltage measurement against the first electrically conductive layer 3 and the second electrically conductive layer 5 and applying a voltage.

However, in the case of the laminate web for capacitor layer 1a in this variation, it is necessary to avoid a contact condition as shown in FIG. 10(B), because the lateral end portions of the first electrically conductive layer 3, dielectric layer 4 and second electrically conductive layer 5 in the positions of lateral end sides Sd1, Sd2 along the winding-up direction overlap each other in the same position. For this reason, in the lateral end portions of both of the first electrically conductive layer 3 and the second electrically conductive layer 5, materials which have a shape free from deformation or a split or a break during cutting must be used. For example, metal foil which is not slit must be used.

Interlayer dielectric means: The "interlayer dielectric means" called in this specification is provided for the following purpose. By providing interlayer dielectric means on one side of the above-described laminate web for capacitor layer 1a, an electrical insulation condition is formed between areas of the laminate web for capacitor layer which overlap each other when the laminate web for capacitor layer is wound in a roll state. In general, it is preferred that either of the following two methods be used to provide this interlayer dielectric means. Because the interlayer dielectric means is common to all variations, its description is given only here and the description of other variations is omitted.

That is, it is preferred that either of the following two methods be used to provide this interlayer dielectric means. i) An insulating resin film is provided on one surface of the laminate web for capacitor layer. ii) An insulating resin film F be superposed on one surface of the laminate web for capacitor layer. In the case of i) where a resin film is provided, an insulating resin film, such as an epoxy-base resin, an acrylic-base resin, a polyimide-base resin and a polyamide-base resin is formed by coating on the outer surface side of either of the first electrically conductive layer 3 or the second electrically conductive layer 5 as an insulating resin which permits release of removal by melting (in the figure, the description of this insulating film layer is omitted). In the case of ii) where an insulating resin film F is used, a film formed from a resin material as described above is provided either on the top side or the bottom side of the laminate web for capacitor layer 1a (in FIGS. 1(A) and 1(C), on the bottom side of the laminate web for capacitor layer 1a) in such a manner that the insulating resin film F is superposed on the laminate web for capacitor layer 1a as shown in FIGS. 1(A) and 1(C), and the laminate web for capacitor layer 1a and the insulating resin film F are simultaneously spliced to the core tube 2 and wound up to form a roll of laminate for capacitor layer for withstand voltage inspection in a roll state.

Method of splicing the laminate web for capacitor layer and the insulating resin film to the core tube: This splicing method involves, as schematically shown in FIG. 1(B), simultaneously or individually joining the superposed laminate web for capacitor layer 1a and the insulating resin film F to the core tube by bonding and performing winding-up work. It is also possible to use almost all generally adopted splicing methods in addition to the splicing method disclosed here. Because this splicing method is common to all variations except the sixth variation and the seventh variation, the description is omitted in other variations to avoid overlaps of description.

<Second Variation>

A second roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length than the size of the metal foil webs of the first electrically conductive layer and the second electrically conductive layer" and bonding these layers in a laminated state, the first electrically conductive layer and the second electrically conductive layer being disposed so as to be in a symmetric position via the dielectric layer, the end face position of the two electrically conductive layers on the start end side and the terminal end side being the same, and the dielectric layer positioned between the first electrically conductive layer and the second electrically conductive layer protruding by not less than 2 mm from peripheral ends of the first electrically conductive layer and the second electrically conductive layer, and wherein by providing interlayer dielectric means on one side of this laminate web for capacitor layer, an electrical insulation condition is formed between areas of the laminate web for capacitor layer which overlap each other when the laminate web for capacitor layer is wound in a roll state."

Laminate web for capacitor layer: In the second variation, the laminate web for capacitor layer 1b is constituted by "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length than the size of the metal foil webs of the first electrically conductive layer and the second electrically conductive layer." That is, although the first electrically conductive layer 3 and the second electrically conductive layer 5 are each a metal foil web of the same size, the dielectric layer 4 which is one size larger than the first electrically conductive layer 3 and the second electrically conductive layer 5 is provided. As a result of this, as can be comprehensively judged from the drawings of FIGS. 2(A), 2(B) and 2(C), it becomes possible to cause the dielectric layer 4 to protrude over distances corresponding to D1 and D2 shown in FIGS. 2(B) and 2(C) from each of the peripheral parts of the first electrically conductive layer 3 and the second electrically conductive layer 5, i.e., the start end side S, the terminal end side E and lateral end sides on both sides Sd1, Sd2.

Because the contact and the occurrence of discharge at end portions can be prevented by obtaining the laminate web for capacitor layer 1b having such a construction, it is possible to perform quality assurance related to withstand voltage along the full length of the laminate web for capacitor layer 1b by pressing probes for withstand voltage measurement against the first electrically conductive layer 3 and the second electrically conductive layer 5 and applying a voltage. Furthermore, in the first variation, in the lateral end portions of both of the first electrically conductive layer 3 and the second electrically conductive layer 5, materials which have a shape in a condition free from deformation or a split or a break during cutting must be used, whereas in the case of the second variation, even if deformation or a split or a break during cutting exists in the lateral end portions of both of the first electrically conductive layer 3 and the second electrically conductive layer 5, the contact between the first electrically conductive layer 3 and the second electrically conductive layer 5 and a discharge during voltage application are effectively prevented because the dielectric layer 4 protrudes from the lateral end portions.

Because the first electrically conductive layer 3, the second electrically conductive layer 5, the dielectric layer 4 and the interlayer dielectric means are the same as described in the first variation, their descriptions are omitted here to avoid overlaps of description.

<Third Variation>

A third roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length and which is larger by not less than 2 mm in width than the size of the metal foil webs of the first electrically conductive layer and the second electrically conductive layer" and bonding these layers in a laminated state, the first electrically conductive layer being disposed with respect to the dielectric layer so that one lateral end side of the first electrically conductive layer coincides with one lateral end side of the dielectric layer and, at the same time, so that the dielectric layer protrudes by not less than 2 mm from the start end side and terminal end side of the first electrically conductive layer, and the second electrically conductive layer being disposed with respect to the dielectric layer so that one lateral end side of the second electrically conductive layer coincides with the other lateral end side of the dielectric layer and, at the same time, so that the dielectric layer protrudes by not less than 2 mm from the start end side and terminal end side of the second electrically conductive layer, and wherein by providing interlayer dielectric means on one side of this laminate web for capacitor layer, an electrical insulation condition is formed between areas of the laminate web for capacitor layer which overlap each other when the laminate web for capacitor layer is wound in a roll state."

Laminate web for capacitor layer: A laminate web for capacitor layer 1c in this variation is constituted by "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length and larger by not less than 2 mm in width than the size of the metal foil webs of the first electrically conductive layer and the second electrically conductive layer." That is, although the first electrically conductive layer 3 and the second electrically conductive layer 5 are each a metal foil web of the same size, the dielectric layer 4 which is one size larger than the first electrically conductive layer 3 and the second electrically conductive layer 5 is provided.

As can be comprehensively judged from the three Drawings of FIGS. 3(A), 3(B) and 3(C), the positional relationship between the first electrically conductive layer 3 and the dielectric layer 4 is such that the first electrically conductive layer 3 and the dielectric layer 4 are disposed in such a manner that the lateral end side on one side of the first electrically conductive layer 3 and one lateral end side of the dielectric layer 4 coincide with each other and, at the same time, the dielectric layer 4 protrudes by not less than 2 mm from the start end side S and terminal end side E of the first electrically conductive layer 3. And the positional relationship between the second electrically conductive layer 5 and the dielectric layer 4 is such that the second electrically conductive layer 5 and the dielectric layer 4 are disposed in such a manner that the lateral end side on one side of the second electrically conductive layer 5 and the other lateral end side of the dielectric layer 4 coincide with each other and, at the same time, the dielectric layer 4 protrudes by not less than 2 mm from the start end side and terminal end side of the second electrically conductive layer 5. Therefore, as a result, the positional relationship between the first electrically conductive layer 3 and the second electrically conductive layer 5 at this time is such that the two electrically conductive layers have the same position only in their end face position at the start end side S and terminal end side E thereof via the dielectric layer and, at the same time, they have a displacement of not less than 2 mm in the transverse direction W.

By obtaining the laminate web for capacitor layer 1c having such a construction, as is apparent from FIGS. 3(A) to 3(C), at the lateral end sides Sd1, Sd2 of the first electrically conductive layer 3 and the second electrically conductive layer 5, there is no electrically conductive layer opposed to the protruding portions of the first electrically conductive layer 3 and the second electrically conductive layer 5 and hence the portion of the dielectric layer 4 corresponding to the distance D2 shown in FIG. 3(C) is in an exposed state.

Moreover, it becomes possible to cause the dielectric layer 4 to protrude from each of the start end side S and the terminal end side E over a distance of not less than 2 mm corresponding to D1. Because as a result, the contact between the first electrically conductive layer 3 and the second electrically conductive layer 5 and the occurrence of discharge at each end portion can be prevented, it is possible to perform quality assurance related to withstand voltage along the fill length of the laminate web for capacitor layer 1c by pressing probes for withstand voltage measurement against the first electrically conductive layer 3 and the second electrically conductive layer 5 and applying a voltage.

Because the first electrically conductive layer 3, the second electrically conductive layer 5, the dielectric layer 4 and the interlayer dielectric means are the same as described in the first variation, their descriptions are omitted here to avoid overlaps of description.

<Fourth Variation>

A fourth roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a dielectric layer having the same size as the metal foil web of the second electrically conductive layer" and "a metal foil web which forms the first electrically conductive layer having a size which is shorter by not less than 4 mm in length than the size of the metal foil web of the second electrically conductive layer," the second electrically conductive layer and the dielectric layer being disposed so that there is no displacement in width and length, and the first electrically conductive layer and the second electrically conductive layer being disposed via the dielectric layer so that a displacement of not less than 2 mm is produced on the start end side and terminal end side in the longitudinal direction, and wherein by providing interlayer dielectric means on one side of this laminate web for capacitor layer, an electrical insulation condition is formed between areas of the laminate web for capacitor layer which overlap each other when the laminate web for capacitor layer is wound in a roll state."

Laminate web for capacitor layer: A laminate web for capacitor layer 1d in the fourth variation is constituted by "a metal foil web which forms the second electrically conductive layer having a prescribed size," "a dielectric layer having the same size as the metal foil web of the second electrically conductive layer" and "a metal foil web which forms the first electrically conductive layer having a size which is shorter by not less than 4 mm in length than the size of the metal foil web of the second electrically conductive layer."

As can be comprehensively judged from the three drawings of FIGS. 4(A), 4(B) and 4(C), a concept of winding the laminate web for capacitor layer 1d of the fourth variation around the core tube 2 is shown. As is apparent from FIGS. 4(A), 4(B) and 4(C), because the metal foil web constituting the second electrically conductive layer 5 and the dielectric layer 4 have the same size, the both is in a state bonded together without what is called a displacement. And by using a metal foil web which forms the first electrically conductive layer having a size which is shorter by not less than 4 mm in length than the size of the metal foil web of the second electrically conductive layer in the first electrically conductive layer 3, which is provided on the dielectric layer 4, the portions of the second electrically conductive layer 5 and the dielectric layer 4 corresponding to a distance D1 in FIG. 4(B) protrude in a state bonded together at the start end side S and the terminal end side E in the longitudinal direction.

Because the contact between the first electrically conductive layer 3 and the second electrically conductive layer 5 and the occurrence of discharge at end portions can be prevented, as is apparent from FIGS. 4(A), 4(B) and 4(C), by obtaining the laminate web for capacitor layer 1d having such a construction, it is possible to perform quality assurance related to withstand voltage along the full length of the laminate web for capacitor layer 1d by pressing probes for withstand voltage measurement against the first electrically conductive layer 3 and the second electrically conductive layer 5 and applying a voltage.

However, in the case of the laminate for capacitor layer 1d in this variation, it is necessary to avoid a contact condition as shown in FIG. 10(B), because the lateral end portions of the first electrically conductive layer 3, dielectric layer 4 and second electrically conductive layer 5 in the positions of lateral end sides Sd1, Sd2 along the winding-up direction overlap each other in the same position. For this reason, in the lateral end portions of both of the first electrically conductive layer 3 and the second electrically conductive layer 5, materials which have a shape free from deformation or a split or a break during cutting must be used. For example, metal foil which is not slit must be used.

Because the first electrically conductive layer 3, the second electrically conductive layer 5, the dielectric layer 4 and the interlayer dielectric means are the same as described in the first variation, their descriptions are omitted here to avoid overlaps of description.

<Fifth Variation>

A fifth roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a dielectric layer having the same size as the metal foil web of the second electrically conductive layer" and "a metal foil web which forms the first electrically conductive layer having a size which is shorter by not less than 4 mm in length and width than the size of the metal foil web of the second electrically conductive layer," the second electrically conductive layer and the dielectric layer being disposed so that positions of length and width on the start end side and terminal end side coincide with each other, the second electrically conductive layer and the dielectric layer being disposed so that the two lateral ends sides of the second electrically conductive layer and the dielectric layer protrude by not less than two mm from the two lateral end sides of the first electrically conductive layer and so that the second electrically conductive layer and the dielectric layer protrude by not less than 2 mm from the start end side and terminal end side of the first electrically conductive layer in the longitudinal direction thereof, and wherein by providing interlayer dielectric means on one side of this laminate web for capacitor layer, an electrical insulation condition is formed between areas of the laminate web for capacitor layer which overlap each other when the laminate web for capacitor layer is wound in a roll state."

Laminate web for capacitor layer: A laminate web for capacitor layer 1e in the fifth variation is constituted by "a metal foil web which forms the second electrically conductive layer having a prescribed size," "a dielectric layer having the same size as the metal foil web of the second electrically conductive layer" and "a metal foil web which forms the first electrically conductive layer having a size which is smaller by not less than 4 mm in length and width than the size of the metal foil web of the second electrically conductive layer."

As can be comprehensively judged from the three drawings of FIGS. 5(A), 5(B) and 5(C), a concept of winding the laminate web for capacitor layer 1e of the fifth variation around the core tube 2 is shown. As is apparent from FIGS. 5(A), 5(B) and 5(C), the basic arrangement of the first electrically conductive layer 3, the dielectric layer 4 and the second electrically conductive layer 5 in the fifth variation is common to the fourth variation. What is different is that a metal foil web having a size which is smaller by not less than 4 mm in length and width than the size of the metal foil web of the second electrically conductive layer is used as the first electrically conductive layer 3 and hence on each of the two lateral side ends Sd1, Sd2 of the dielectric layer 4 and second electrically conductive layer 5, the first electrically conductive layer 3 is shorter by a distance D2 shown in FIG. 5(C). This distance is not less than 2 mm.

By obtaining the laminate web for capacitor layer 1e having such a construction, as is apparent from FIGS. 5(A) to 5(C), on the lateral end sides Sd1, Sd2 of the first electrically conductive layer 3, there are protruding portions of the dielectric layer 4 and the second electrically conductive layer 5. Moreover, it becomes possible to cause the dielectric layer 4 and the second electrically conductive layer 5 to protrude from each of the start end side S and the terminal end side E by a distance of not less than 2 mm. Because as a result, the contact between the first electrically conductive layer 3 and the second electrically conductive layer 5 and the occurrence of discharge in each end portion can be prevented, it is possible to perform quality assurance related to withstand voltage along the full length of the laminate web for capacitor layer 1e by pressing probes for withstand voltage measurement against the first electrically conductive layer 3 and the second electrically conductive layer 5 and applying a voltage.

Because the first electrically conductive layer 3, the second electrically conductive layer 5, the dielectric layer 4 and the interlayer dielectric means are the same as described in the first variation, their descriptions are omitted here to avoid overlaps of description.

<Sixth Variation>

A sixth roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a dielectric layer having the same size as the metal foil web of the second electrically conductive layer" and "a metal foil web which forms the first electrically conductive layer having the same size as the size of the metal foil web of the second electrically conductive layer," and bonding these layers, on the start end side and the terminal end side of the laminate for capacitor layer at least any one area selected from an interlayer part between the first electrically conductive layer and the dielectric layer, an interlayer part between the dielectric layer and the second electrically conductive layer and a part in the interior of the dielectric layer being in an unbonded state and forming a slit, and an interposed state being produced by inserting part of a splice tape in this slit part, wherein by providing interlayer dielectric means on one side of this laminate web for capacitor layer, an electrical insulation condition is formed between areas of the laminate web for capacitor layer which overlap each other when the laminate web for capacitor layer is wound in a roll state."

Laminate web for capacitor layer: A laminate web for capacitor layer $1f$ in the sixth variation is constituted by "a metal foil web which forms the second electrically conductive layer having a prescribed size," "a dielectric layer having the same size as the metal foil web of the second electrically conductive layer" and "a metal foil web which forms the first electrically conductive layer having the same size as the size of the metal foil web of the second electrically conductive layer." The feature of this laminate web for capacitor layer $1f$ in the sixth variation resides in the fact that on the start end side S and the terminal end side E of the laminate for capacitor layer $1f$ at least any one area selected from an interlayer part between the first electrically conductive layer and the dielectric layer, an interlayer part between the dielectric layer and the second electrically conductive layer and a part in the interior of the dielectric layer is in an unbonded state and forms a slit. FIG. 6(B) shows in an exemplifying manner a case where a slit G is formed in an interlayer part of the dielectric layer 4. This unbonded part forms the slit G in the transverse direction. As shown in the enlarged figure of FIG. 6(B), part of a splice tape T is inserted in this slit G, and the laminate for capacitor layer $1f$ is bonded to the core tube 2 in this state.

By obtaining the laminate web for capacitor layer $1f$ of such a construction, as can be comprehensively judged from the three drawings of FIGS. 6(A), 6(B) and 6(C), at the start end side S of the first electrically conductive layer 3 and the second electrically conductive layer 5, the splice tape T is present in the transverse direction in the interlayer part between the first electrically conductive layer 3 and the second electrically conductive layer 5. Moreover, at the terminal end side E the interlayer part between the first electrically conductive layer 3 and the second electrically conductive layer 5 is separated due to the presence of the slit G, making it possible to avoid the mutual bonding of the first electrically conductive layer 3 and the second electrically conductive layer 5. It is preferred that the slit G at this time be formed with a depth of not less than 2 cm in order to ensure that the splice tape T can be uniformly inserted in the transverse direction at the start end side S. In contrast, it seems that if the slit G at the terminal end side E has a depth of not less than 5 mm, the contact between the first electrically conductive layer 3 and the second electrically conductive layer 5 can be surely avoided even when the splice tape T is not inserted. However, in terms of safety, it is preferred that also the slit G on the terminal end side E have a depth of not less than 2 cm and the splice tape T be uniformly inserted in the transverse direction. Because as a result of the foregoing, the contact between the first electrically conductive layer 3 and the second electrically conductive layer 5 and the occurrence of discharge at each end portion can be prevented, it is possible to perform quality assurance related to withstand voltage along the full length of the laminate web for capacitor layer $1f$ by pressing probes for withstand voltage measurement against the first electrically conductive layer 3 and the second electrically conductive layer 5 and applying a voltage.

However, in the case of the laminate for capacitor layer $1f$ in this variation, it is necessary to avoid a contact condition as shown in FIG. 10(B), because the lateral end portions of the first electrically conductive layer 3, dielectric layer 4 and second electrically conductive layer 5 in the positions of lateral end sides Sd1, Sd2 along the winding-up direction overlap each other in the same position. For this reason, in the lateral end portions of both of the first electrically conductive layer 3 and the second electrically conductive layer 5, materials which have a shape free from deformation or a split or a break during cutting must be used. For example, metal foil which is not slit must be used.

Because the first electrically conductive layer 3, the second electrically conductive layer 5, the dielectric layer 4 and the interlayer dielectric means are the same as described in the first variation, their descriptions are omitted here to avoid overlaps of description.

<Seventh Variation>

A seventh roll of laminate for capacitor layer for withstand voltage inspection described in a claim is "a roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a first electrically conductive layer having the same size as the metal foil web of the second electrically conductive layer," and "a dielectric layer having a size which is larger by not less than 4 mm in width than the size of the metal foil webs of the first electrically conductive layer and the second electrically conductive layer" and bonding these layers, the first electrically conductive layer and the second electrically conductive layer being disposed so as to be in a symmetric position via the dielectric layer, the end face position of the two electrically conductive layers on the start end side and the terminal end side being the same, the dielectric layer positioned between the first electrically conductive layer and the second electrically conductive layer protruding by not less than 2 mm from the start end side and terminal end side of the first electrically conductive layer and the second electrically conductive layer, at least any one area selected from an interlayer part between the first electrically conductive layer and the dielectric layer, an interlayer part between the dielectric layer and the second electrically conductive layer and a part in the interior of the dielectric layer being in an unbonded state and forming a slit, and an interposed state being produced by inserting part of a splice tape in this slit part, and wherein by providing interlayer dielectric means on one side of this laminate web for capacitor layer, an electrical insulation condition is formed between areas of the laminate web for capacitor layer-which overlap each other when the laminate web for capacitor layer is wound in a roll state."

Laminate web for capacitor layer: A laminate web for capacitor layer $1g$ in the seventh variation is constituted by "a metal foil web which forms the second electrically conductive layer having a prescribed size," "a first electrically conductive layer having the same size as the metal foil web of the second electrically conductive layer," and "a dielectric layer having a size which is larger by not less than 4 mm in width than the size of the metal foil webs of the first electrically conductive layer and the second electrically conductive layer."

As can be comprehensively judged from the three drawings of FIGS. 7(A), 7(B) and 7(C), a concept of winding the laminate web for capacitor layer 1g of the seventh variation around the core tube 2 is shown. As is apparent from FIGS. 7(A), 7(B) and 7(C), the seventh variation is common to the sixth variation in the basic arrangement of the first electrically conductive layer 3, the dielectric layer 4 and the second electrically conductive layer 5 and in the fact that at the start end side S and the terminal end side E at least either of an interlayer part between the first electrically conductive layer 3 and the dielectric layer 4 and an interlayer part between the dielectric layer 3 and the second electrically conductive layer 5 is in an unbonded state. What is different is that a metal foil web having a size which is larger by not less than 4 mm in width than the size of the metal foil webs of the first electrically conductive layer 3 and the second electrically conductive layer 5 is used as the dielectric layer 4 and hence from each of the two lateral side ends Sd1, Sd2 of the first electrically conductive layer 3 and the second electrically conductive layer 5, the dielectric layer 4 is caused to protrude by a length of not less than 2 mm corresponding to a distance D2 shown in FIG. 7(C).

By obtaining the laminate web for capacitor layer 1g having such a construction, as is apparent from FIGS. 7(A) to 7(C), at the lateral end sides Sd1, Sd2 of the first electrically conductive layer 3 and the second electrically conductive layer 5, there are protruding portions of the dielectric layer 4. Moreover, it becomes possible to obtain an effect similar to that described above on the start end side S and the terminal end side E. Because as a result, the contact between the first electrically conductive layer 3 and the second electrically conductive layer 5 and the occurrence of discharge at each end portion can be prevented, it is possible to perform quality assurance related to withstand voltage along the full length of the laminate web for capacitor layer 1g by pressing probes for withstand voltage measurement against the first electrically conductive layer 3 and the second electrically conductive layer 5 and applying a voltage.

Because the first electrically conductive layer 3, the second electrically conductive layer 5, the dielectric layer 4 and the interlayer dielectric means are the same as described in the first variation, their descriptions are omitted here to avoid overlaps of description.

<Method of Withstand Voltage Inspection Using Roll of Laminate for Withstand Voltage Inspection>

This inspection method is carried out by use of a roll of laminate for capacitor layer for printed wiring board for withstand voltage inspection described in any one of the first variation to the seventh variation described above.

The measurement procedure itself is very simple. Part of the interlayer dielectric means on the winding terminal end side of the laminate web for capacitor layer which is positioned in the periphery of a roll of laminate for withstand voltage inspection which is obtained in the manner described in the first variation to the seventh variation above is removed. By bringing probe electrodes for withstand voltage measurement into contact with the first electrically conductive layer and the second electrically conductive layer in this portion and applying a voltage, whether electrical conduction is present along the full length of the laminate web for capacitor layer is ascertained, whereby a pass/fail judgment is made as it is in the state of roll. By adopting this method, it becomes possible to perform quality assurance related to withstand voltage along the full length of the laminate web for capacitor layer 1a to 1g.

BRIEF DESCRIPTION OF THE DRAWINGS

FIGS. 1(A), 1(B) and 1(C) to FIGS. 7(A), 7(B) and 7(C) are each a schematic illustration showing a concept of winding a laminate for capacitor layer around a core tube;

DETAILED DESCRIPTION OF THE PREFERRED EMBODIMENTS

Figure 1:
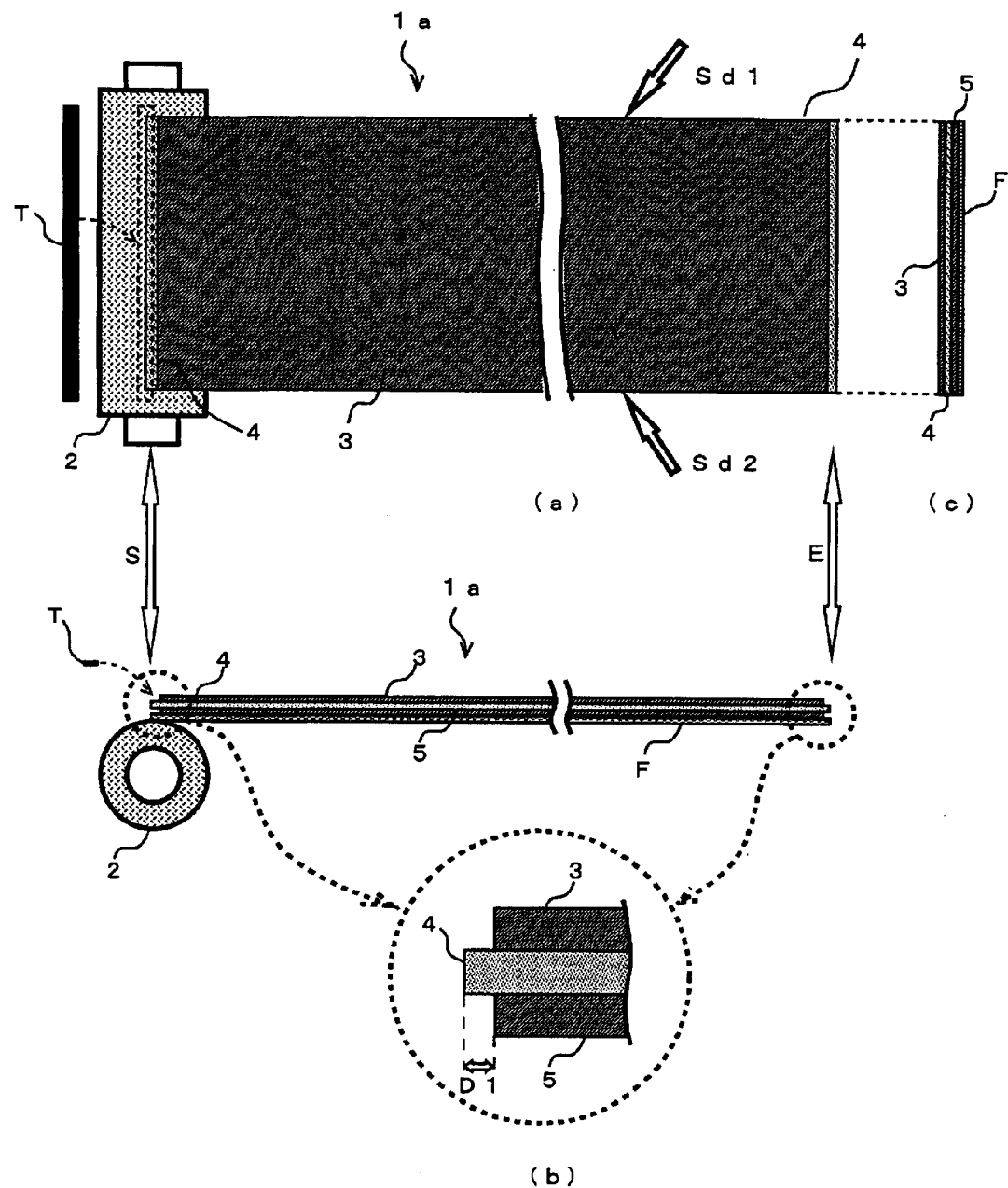

In the following embodiments, laminate webs for capacitor layer considered to have the highest safety among the first variation to the seventh variation are produced and results of withstand voltage measurement are shown.

First embodiment: In this embodiment, a dielectric-layer-formed copper laminate web was produced, this dielectric-layer-formed copper laminate was used as the first electrically conductive layer 3 and the second electrically conductive layer 5, an aromatic polyamide film was used as a dielectric layer film in the core material of the dielectric layer 4, and the laminate web for capacitor layer 1b was produced as shown in the second variation (FIGS. 2(A) to 2(C)). Therefore, first, the manufacturing of the dielectric-layer-formed copper laminate used as the first electrically conductive layer 3 and the second electrically conductive layer 5 is described. The thermosetting resin which composes the resin layer of the dielectric-layer-formed copper foil was prepared as follows.

30 parts by weight of bisphenol Type A phenoxy resin (made by Toto Kasei Corporation, YP-50), 30 parts by weight of bisphenol Type A epoxy resin (made by Yuka Shell Epoxy Corporation, EPICOTE 828), 40 parts by weight of cresol novolak type epoxy resin (made by Toto Kasei Corporation, YDCN704), 2.5 parts by weight of dicyandiamide as a curing agent, and 0.1 part by weight of 2-ethyl-4-methyl imidazole as a curing accelerator were dissolved in a solvent (DMF), and a thermosetting resin was prepared.

The thermosetting resin prepared as described above was applied to the adhesive surface of 35 $\mu$m thick low-profile copper foil (made by Mitsui Kogyo Co., MLS) and dried at 130° C. for 3 minutes, and dielectric-layer-formed copper foil provided with a thermosetting resin layer having a thickness of 5 $\mu$m in terms of dry thickness in what is called a B stage (semicured) state was obtained. This thermosetting resin layer performs the role of a binder with the aromatic polyamide film and constitutes part of the dielectric layer 4 which is finally obtained. The dielectric-film-formed copper foil thus obtained has a size of 500 mm in width×100 m (10000 cm) in length. In this embodiment, the first electrically conductive layer 3 and the second electrically conductive layer 5 have the same size.

On the other hand, an aromatic polyamide film having a thickness of 4 $\mu$m and a dielectric constant of 4.0 (made by Asahi Kasei Corporation, product name ARAMICA) was used as the dielectric film 6 and its two surfaces were subjected to corona discharge treatment and roughened thereby to improve the adhesive property. In this embodiment, the dielectric layer 4 must have a size which is larger by not less than 4 mm in full length and width than the metal foil webs of the first electrically conductive layer 3 and the second electrically conductive layer 5. Therefore, the dielectric film 6 used here had a size of 510 mm in width and 10001 cm in length.

Figure 8:
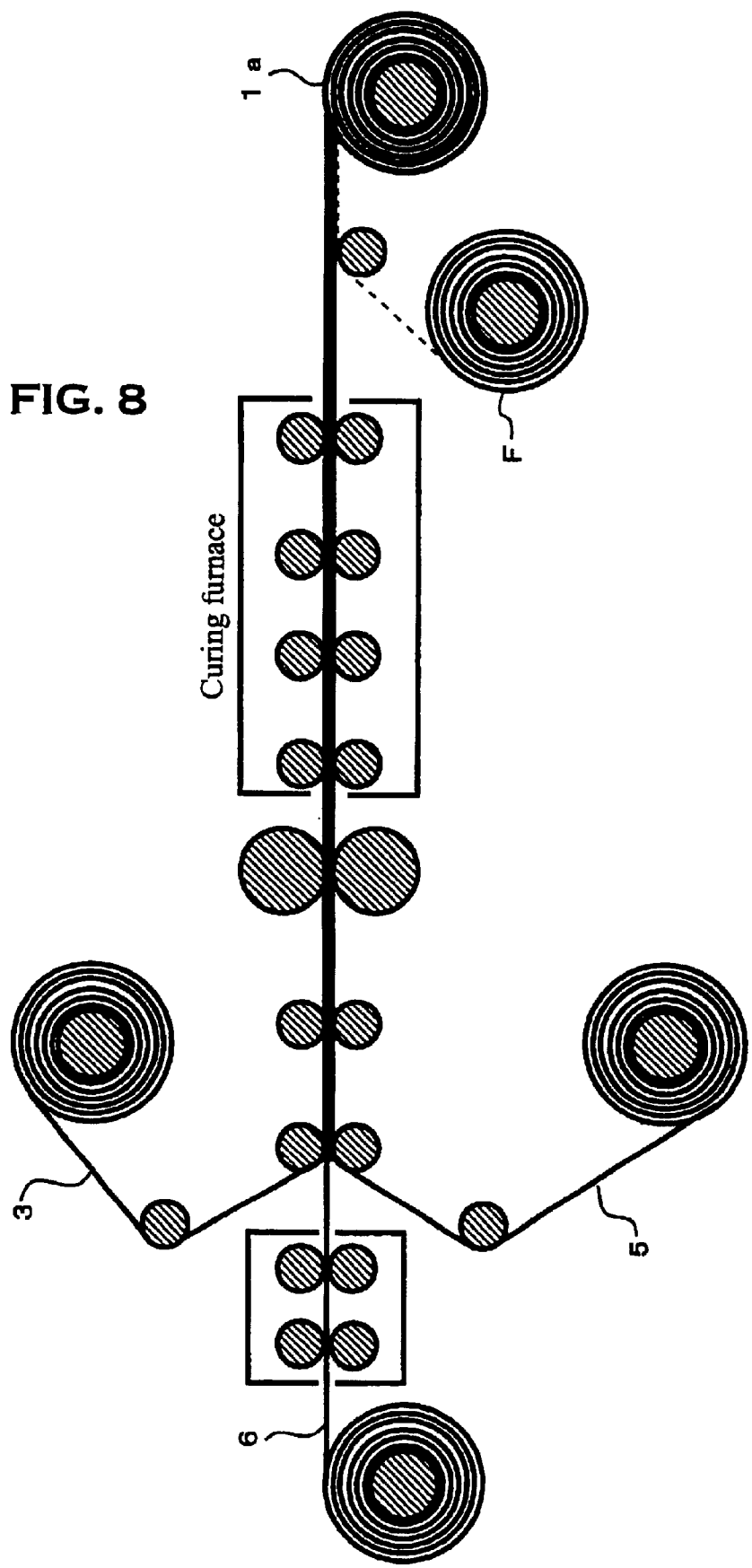
FIGS. 8 and 9 are each a schematic illustration showing an image of continuous laminating.

As shown in FIG. 8, the resin surface of the dielectric-layer-formed copper foil which constitutes the second electrically conductive layer 5 was placed so as to face upward, the dielectric film 6 was superposed on this resin surface, and the dielectric-film-formed copper foil which becomes the first electrically conductive layer 3 was superposed on this dielectric film 6 so as to face downward. And they were continuously laminated in this state. At this time, the first electrically conductive layer 3 and the second electrically conductive layer 5 were disposed so as to be in a symmetric position via the dielectric layer 4, the end face position of the two electrically conductive layers on the start end side and the terminal end side was the same, and the dielectric layer 4 positioned between the first electrically conductive layer 3 and the second electrically conductive layer 5 protruded by 5 mm from peripheral ends of the first electrically conductive layer 3 and the second electrically conductive layer 5. In the continuous laminating method adopted that time, in the laminating step, an atmosphere region permitting partial vacuum hot pressing was prepared and the laminate web for capacitor layer 1b was obtained by adding a quantity of heat corresponding to 165° C. for 60 minutes in the atmosphere.

Figure 2:
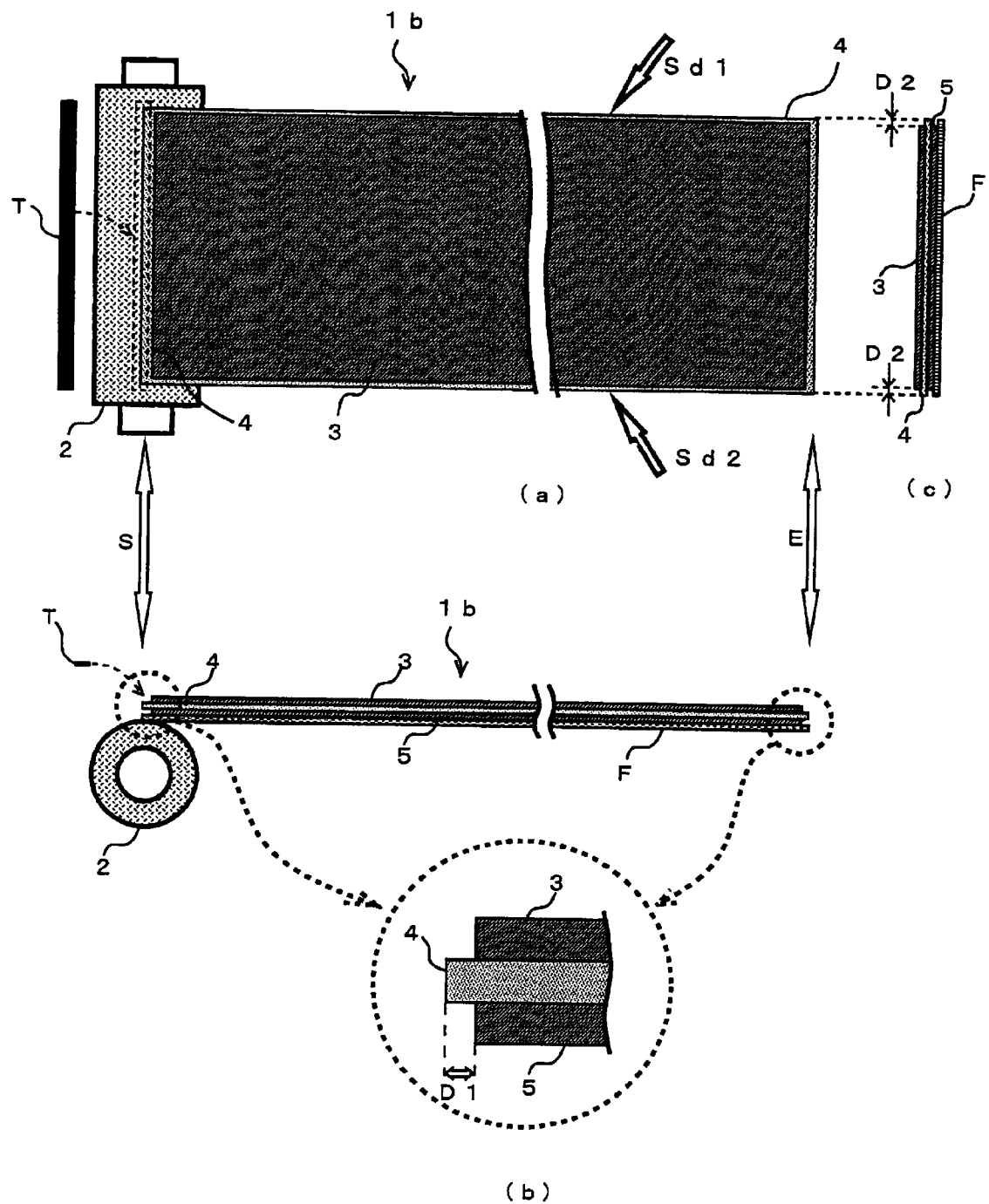

The laminate web for capacitor layer 1b produced by the above-described method on the surface of which an insulating film F (shown in FIG. 2(B)) having a size of 512 mm in width×10003 cm in length was superposed was bonded to the core tube 2 by use of the splice tape T and wound up, whereby a roll of laminate for capacitor layer for withstand voltage inspection was obtained.

The insulating film F on the terminal end side E in the periphery of this roll of laminate for capacitor layer for withstand voltage inspection was partially exfoliated, probes for withstand voltage inspection were abutted against each of the first electrically conductive layer 3 and the second electrically conductive layer 5, and a withstand voltage test was carried out at 500 V, DC, for 30 seconds in accordance with the IPC-TM-650 Standard, Paragraph 2.5.7. As a result, no short circuit occurred in the roll of laminate for capacitor layer for withstand voltage inspection and the test could be smoothly conducted.

Second embodiment: In this embodiment, a dielectric-layer-formed copper laminate web was produced, this dielectric-layer-formed copper laminate was used as the first electrically conductive layer 3 and the second electrically conductive layer 5, an aromatic polyamide film was used as a dielectric layer film in the core material of the dielectric layer 4, and the laminate web for capacitor layer 1c was produced as shown in the third variation (FIGS. 3(A) to 3(C)).

Because the metal foil web which forms the first electrically conductive layer 3 and the metal foil web which forms the second electrically conductive layer 5 have the same size, laminate webs similar to those of the first embodiment were used. And a dielectric film 6 similar to that of the first embodiment was used also as "a dielectric layer having a size which is longer by not less than 4 mm in full length and larger by not less than 2 mm in width than the size of the metal foil webs of the first electrically conductive layer and the second electrically conductive layer."

By use of a continuous laminating method similar to that of the first embodiment, the first electrically conductive layer 3 was disposed with respect to the dielectric layer 4 so that one lateral end side Sd2 of the first electrically conductive layer coincides with one lateral end side of the dielectric layer 4 and, at the same time, so that the dielectric layer protrudes by not less than 2 mm from the start end side S and terminal end side E of the first electrically conductive layer. On the other hand, continuous laminating was performed in such a manner that the second electrically conductive layer 5 was disposed with respect to the dielectric layer 4 so that one lateral end side Sd1 of the second electrically conductive layer coincides with the other lateral end side of the dielectric layer 4 and, at the same time, so that the dielectric layer protrudes by not less than 2 mm from the start end side S and terminal end side E of the second electrically conductive layer, whereby the laminate web for capacitor layer 1c in a state shown in FIGS. 3(A) to 3(C) was obtained. The thermal conditions for continuous laminating were the same as in the first embodiment.

Figure 3:
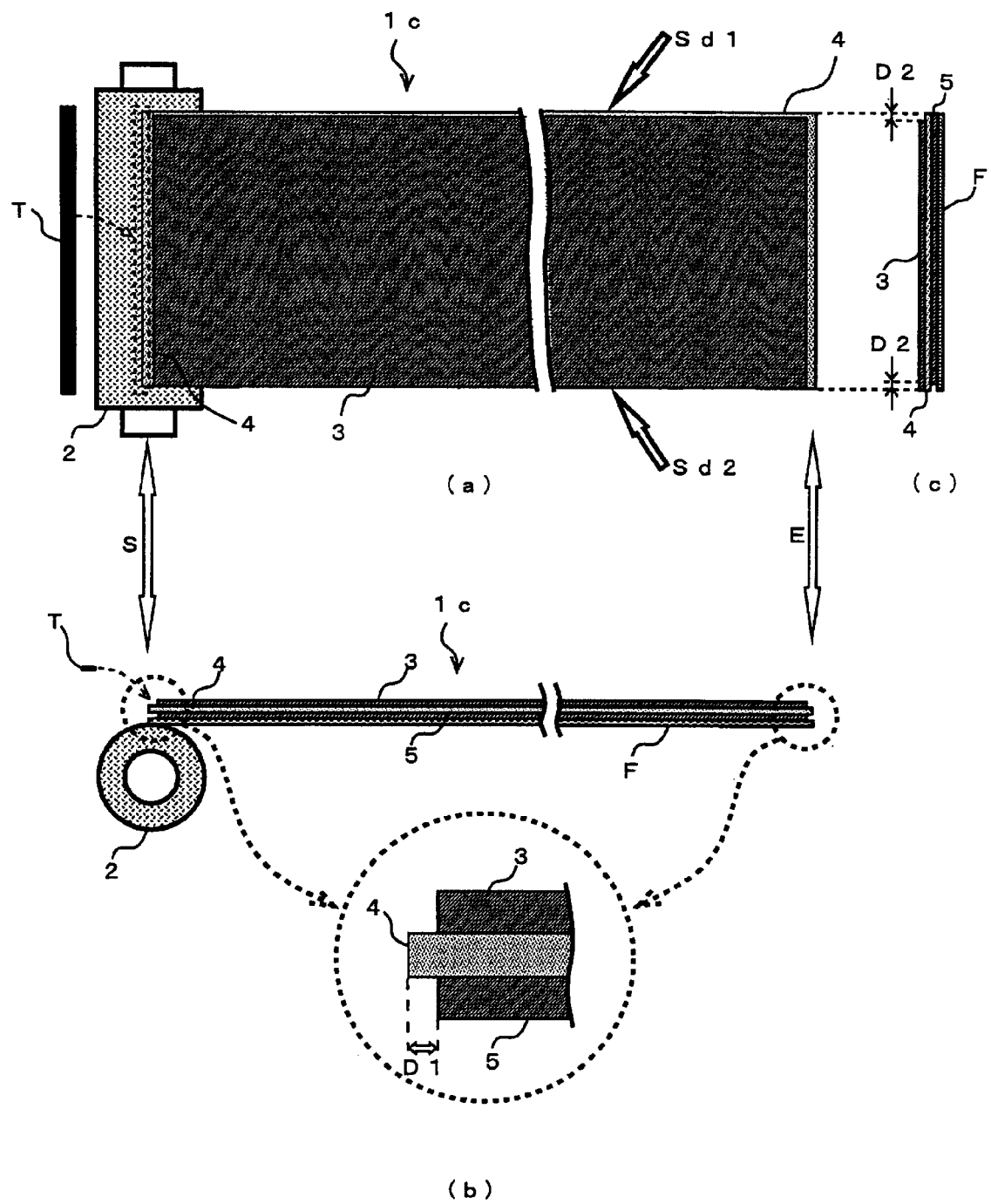
Figure 4:
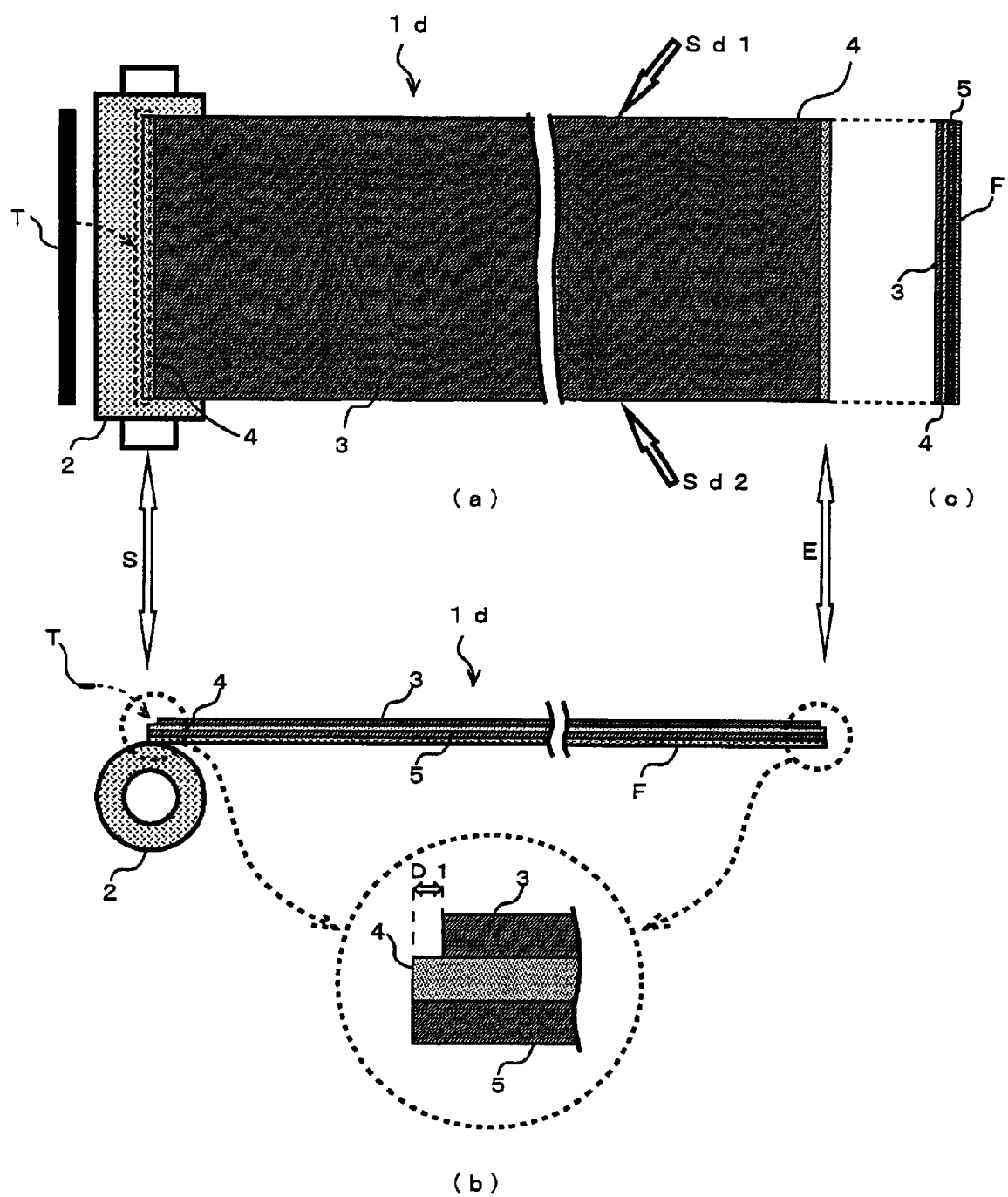

Furthermore, the laminate web for capacitor layer 1c produced by the above-described method on the surface of which an insulating film F (shown in FIG. 3(B)) having a size of 512 mm in width×10003 cm in length was superposed was bonded to the core tube 2 by use of the splice tape T and wound up, whereby a roll of laminate for capacitor layer for withstand voltage inspection was obtained.

The insulating film F on the terminal end side E in the periphery of this roll of laminate for capacitor layer for withstand voltage inspection was partially exfoliated, and a withstand voltage test was performed through a method similar to that of the first embodiment. As a result, the withstand voltage measurement could be satisfactorily conducted without the occurrence of the short circuit phenomenon.

Third embodiment: In this embodiment, a laminate web for capacitor layer 1e as shown in the fifth variation (FIGS. 5(A) to 5(C)) was produced by working a copper foil web which constitutes the second electrically conductive layer 5 into dielectric-layer-formed copper foil and bonding the copper foil which constitutes the first electrically conductive layer 3 to this dielectric-layer-formed copper foil.

The metal foil web which forms the first electrically conductive layer 3 and the metal foil web which forms the second electrically conductive layer 5 have different sizes. That is, by using a metal foil web of the first electrically conductive layer 3 having a size which is smaller by not less than 4 mm in length and width than the size of the metal foil web of the second electrically conductive layer, on each of the two lateral end sides Sd1, Sd2 of the dielectric layer 4 and the second electrically conductive layer 5, the first electrically conductive layer 3 is shorter by a distance of not less than 2 mm shown as D2 in FIG. 5(C). As a result, as is apparent from FIGS. 5(A) to 5(C), on the lateral end sides Sd1, Sd2 of the first electrically conductive layer 3, there are protruding portions of the dielectric layer 4 and the second electrically conductive layer 5. Moreover, it becomes possible to cause the dielectric layer 4 and the second electrically conductive layer 5 to protrude from each of the start end side S and the terminal end side E by a distance of not less than 2 mm.

Therefore, in order to form the dielectric layer 4 as a resin layer containing a dielectric filler, first, a binder resin solution to be used there was produced. In producing this binder resin solution, BP3225-50P made by NIPPON KAYAKU CO., LTD., which is commercially available as a mixed varnish of 25 parts of phenolic novolak type epoxy resin by weight, aromatic polyamide resin polymer soluble in 25 parts of solvent by weight and cyclopetane as a solvent, was used as a raw material. The resin mixture having the following blending ratios was obtained by adding a novolak type phenol resin as a curing agent, MEH-7500 made by Meiwa Chemicals Co., Ltd. and 2E4MZ made by Shikoku Corp. as a curing accelerator to this mixed varnish.

[Binder Resin Composition]

Phenolic novolak type epoxy resin 39 parts by weight
Aromatic polyamide resin polymer 39 parts by weight
Novolak type phenol resin 22 parts by weight
Curing accelerator 0.1 part by weight The resin solid content of this resin mixture was further adjusted to 30 parts by weight by use of methyl ethyl ketone, whereby the binder resin solution was obtained. A barium titanate powder, which is a dielectric filler having the powder characteristics shown below, was mixed and dispersed in this binder resin and a dielectric-filler-containing resin solution having the following composition was obtained.

[Powder Characteristics of Dielectric Filler]

Average particle diameter ($D_{IA}$) 0.25 µm
Weight-cumulative particle diameter ($D_{50}$) 0.5 µm
Degree of aggregation ($D_{50}/D_{IA}$) 2.0

[Dielectric-filler-containing Resin Solution]

Binder resin solution 83.3 parts by weight
Barium titanate powder 100 parts by weight The dielectric-filler-containing resin solution produced as described above was used as a component material of the dielectric layer 4. This dielectric-filler-containing resin solution was applied by use of an edge coater to the surface of 18 µm thick electrolytic copper foil used as the secondary electrically conductive layer 5 so as to form a dielectric-filler-containing resin film having a prescribed thickness, air drying for 5 minutes was performed, and drying for 3 minutes in a heated atmosphere at 140° C. was thereafter performed, whereby the dielectric layer 4 having a thickness of 20 µm was formed in a semicured state and the state of the dielectric-layer-formed copper foil was obtained. The copper foil constituting the second electrically conductive layer 3 at that time had a width of 500 mm and a length of 10000 cm.

Figure 5:
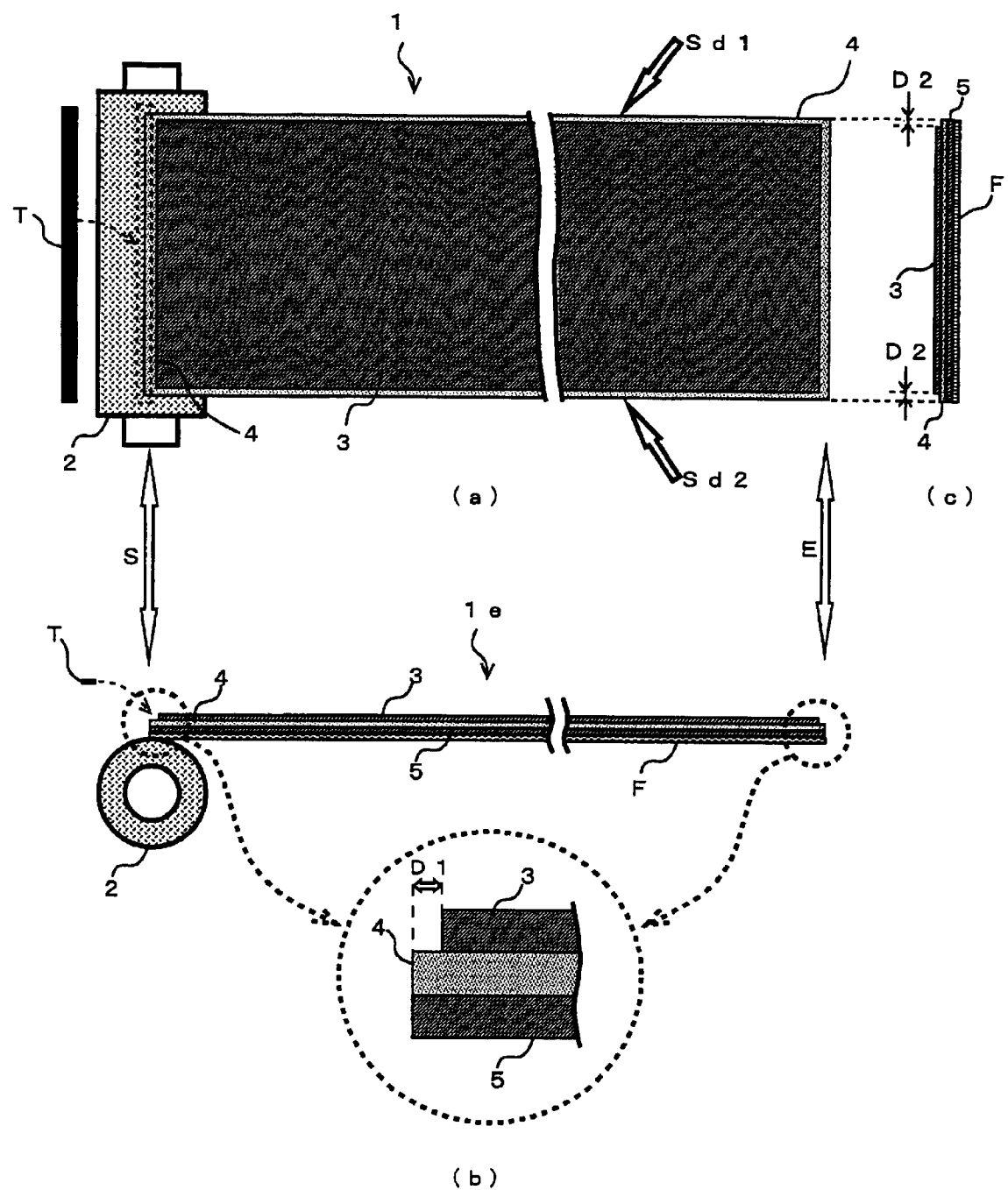
Figure 6:
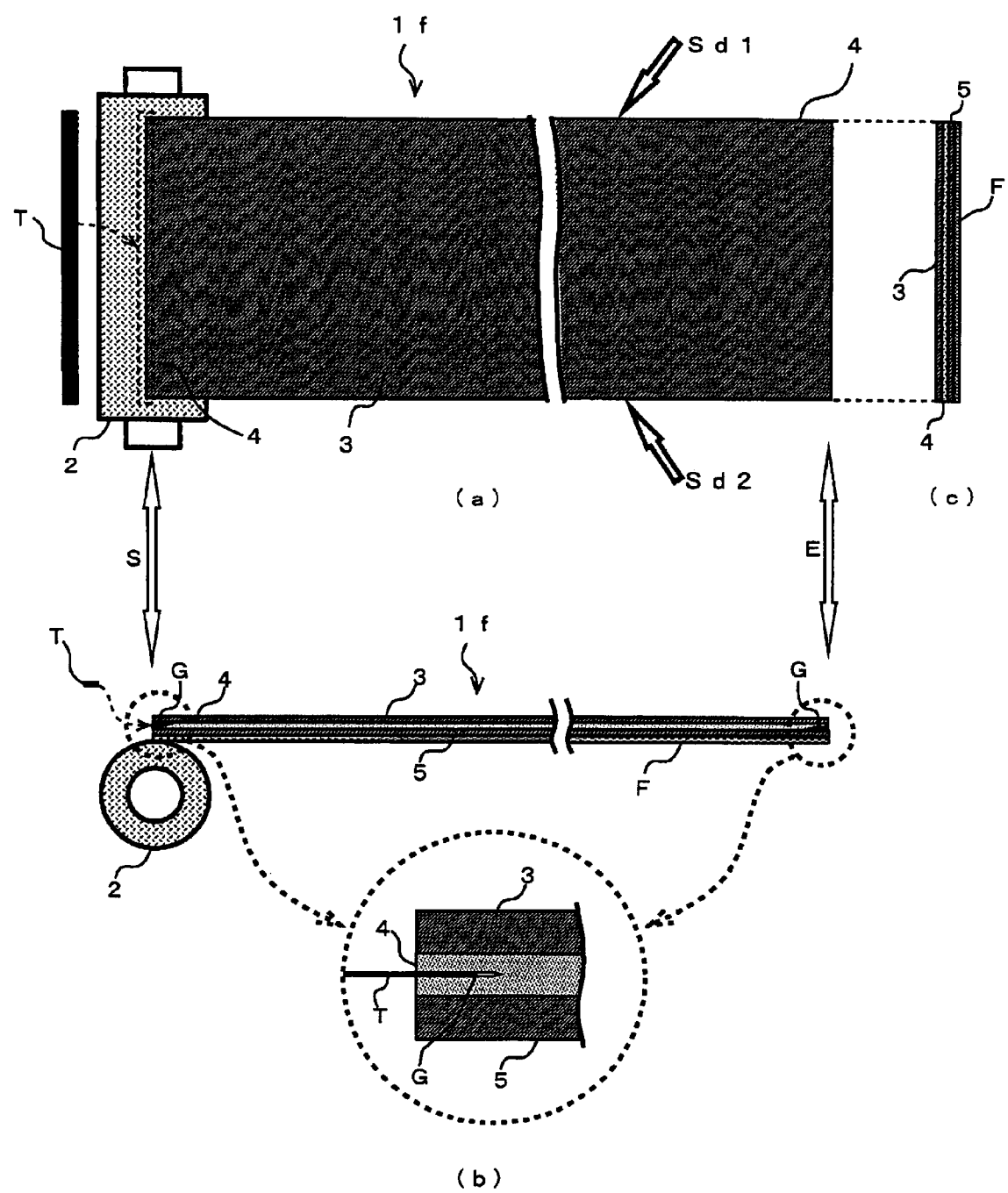
Figure 9:
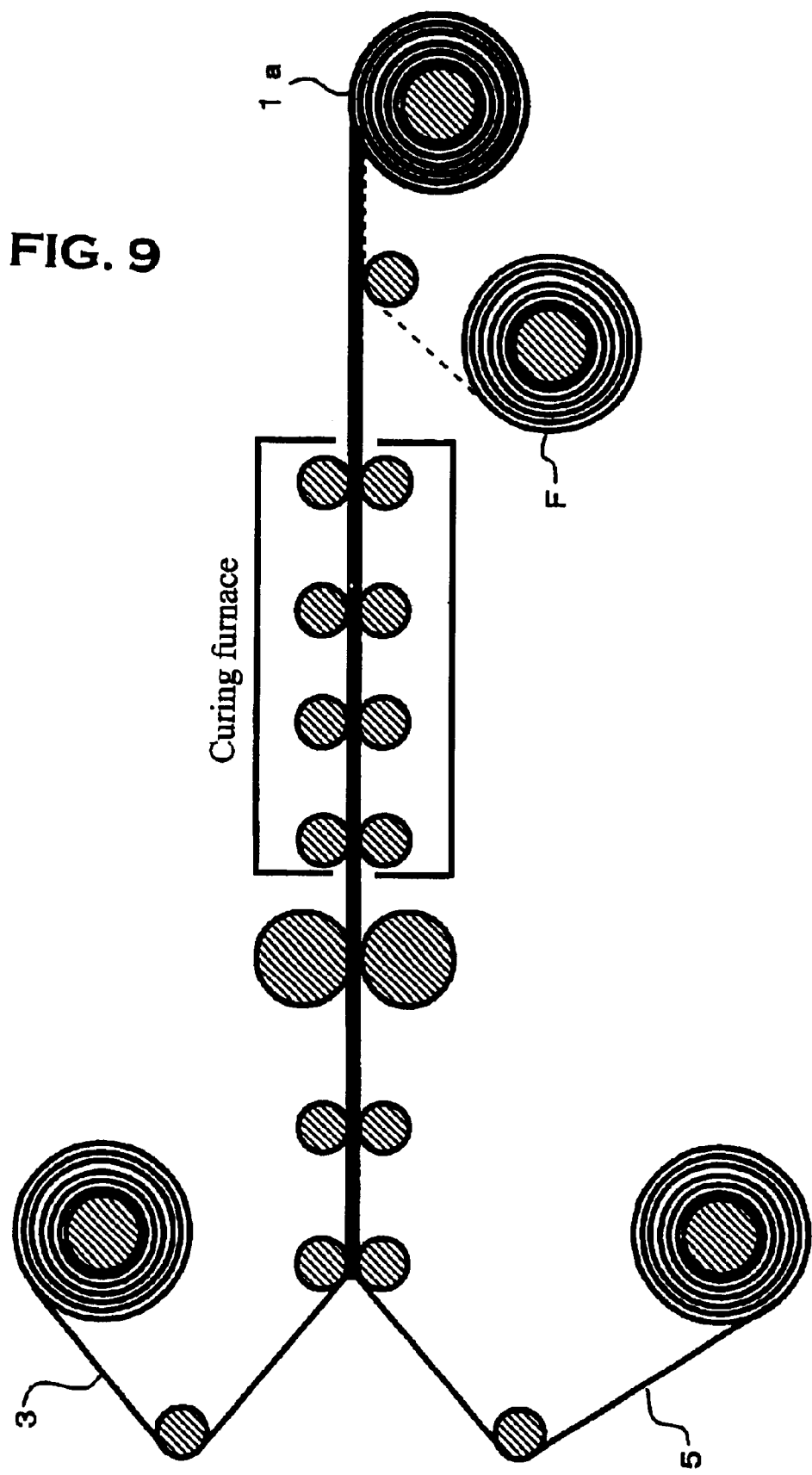
Figure 10:
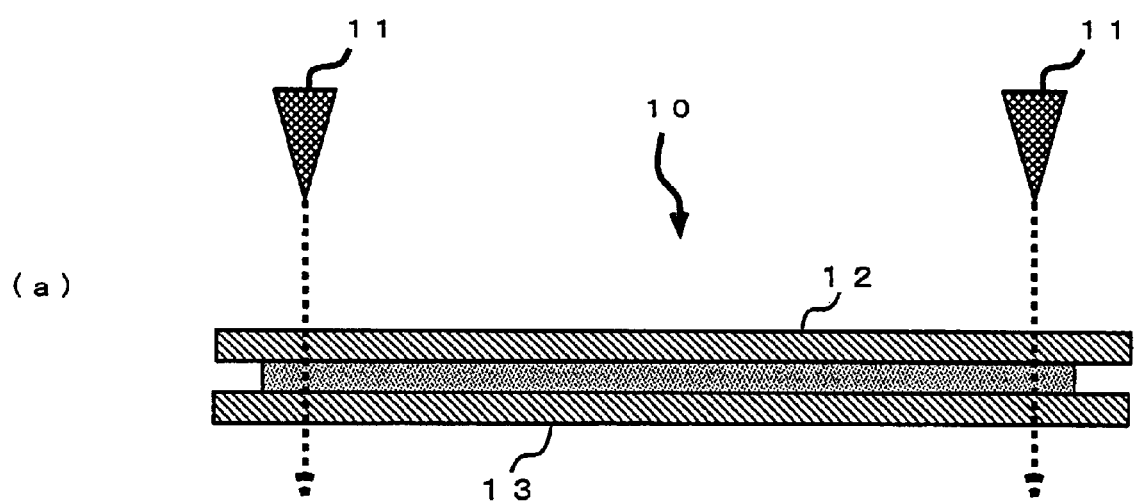
FIG. 10 is a schematic illustration showing an image of short circuit.
Figure 10:
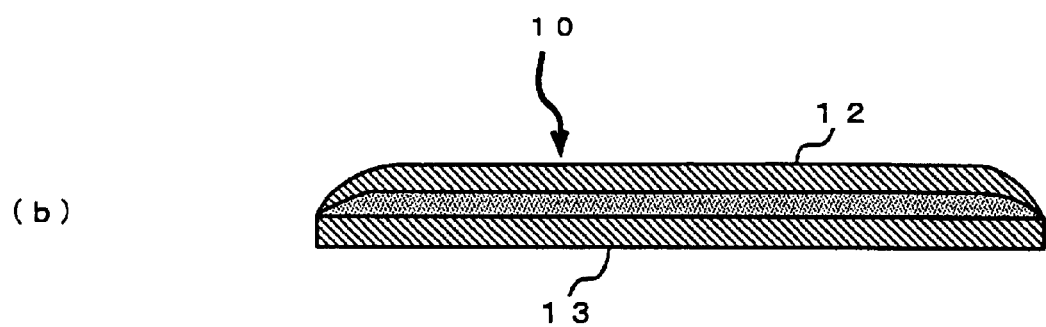
Figure 11:
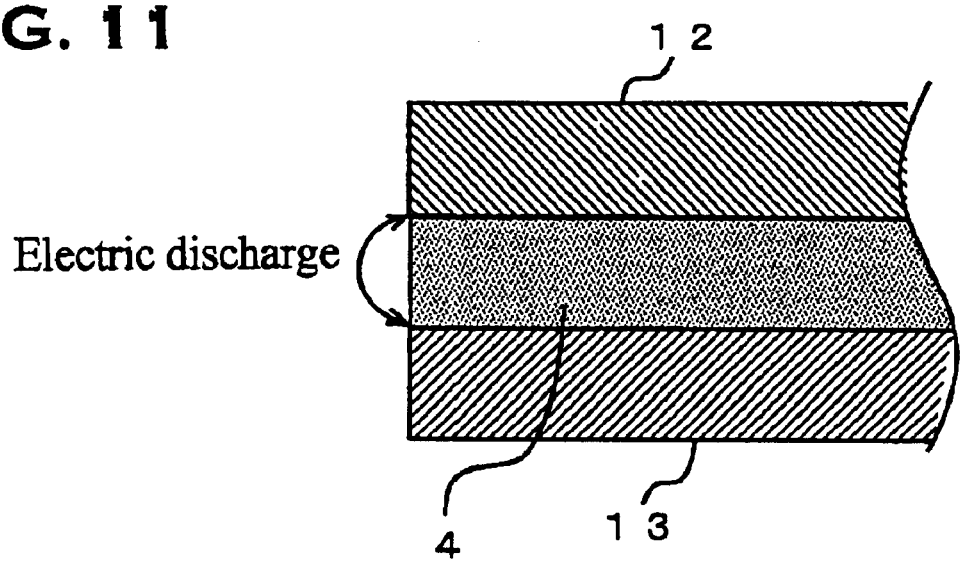
FIG. 11 is a schematic illustration showing an image of discharge phenomenon.

By a continuous laminating method of a concept as shown in FIG. 9, 18 µm thick electrolytic copper foil which constitutes the first electrically conductive layer 3 was bonded to the dielectric layer 4 of the dielectric-layer-formed copper foil thus obtained and the laminate web for capacitor layer 1e, which can be comprehensively judged from FIGS. 5(A) to a(C), was obtained. The heating conditions during laminating adopted at that time were such that a quantity of heat corresponding to 180° C.×60 minutes was applied as a load.

By a method similar to that of the first embodiment a roll of laminate for capacitor layer for withstand voltage inspection was produced from the laminate web for capacitor layer 1e produced as described above and withstand voltage measurement was further carried out by a similar method. As a result, the withstand voltage measurement could be satisfactorily conducted without the occurrence of the short circuit phenomenon.

Figure 7:
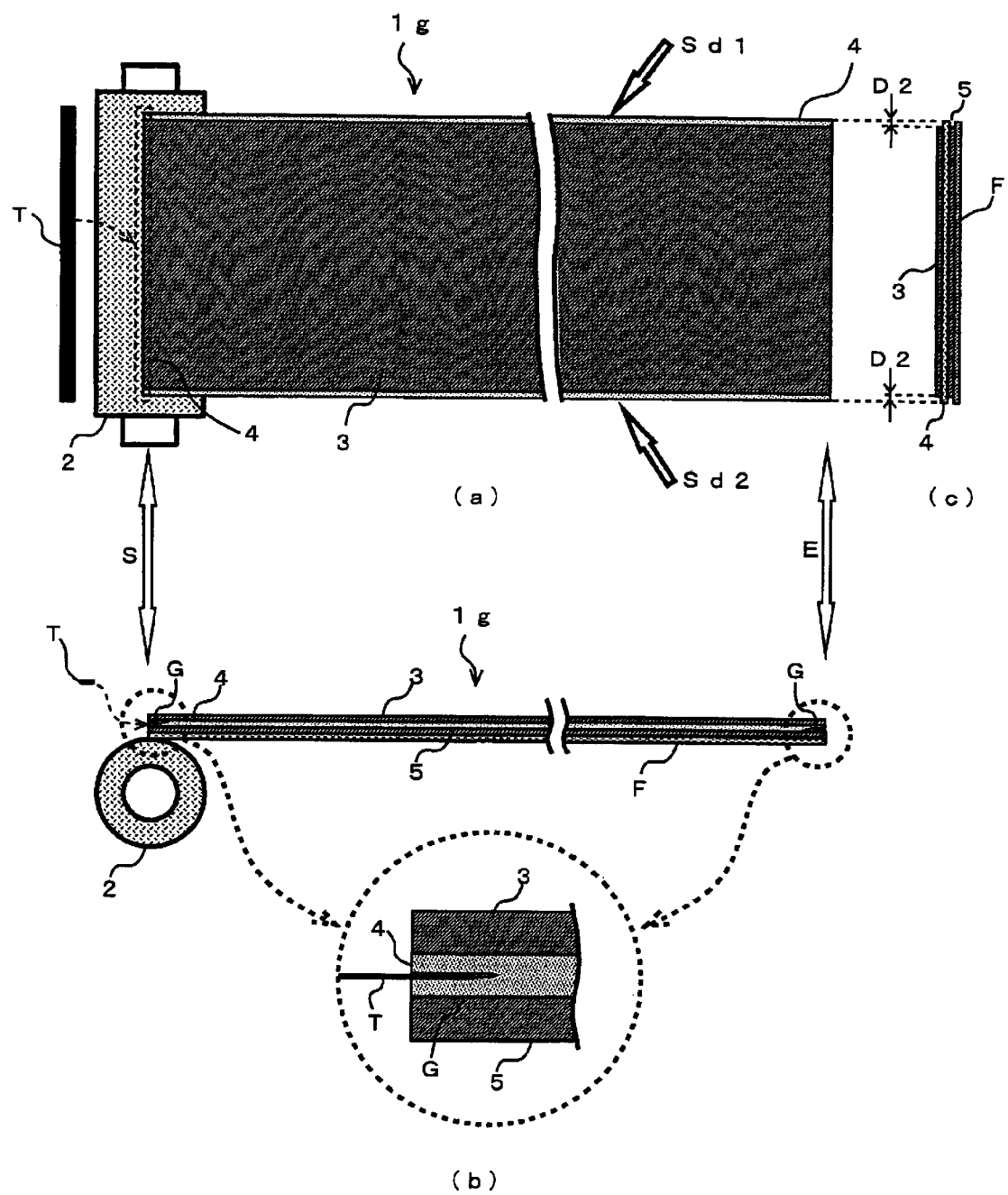

Fourth embodiment: In this embodiment, a laminate web for capacitor layer 1g as shown in the seventh variation (FIGS. 7(A) to 7(C)) was produced by working copper foil webs which constitutes the first electrically conductive layer 3 and the second electrically conductive layer 5 into dielectric-layer-formed copper foil and using an aromatic polyamide film as a dielectric film in the core material of the dielectric layer 4.

In this embodiment, a thermosetting resin prepared by a method similar to that of the first embodiment was applied to the adhesive surface of 35 µm thick low-profile copper foil (made by Mitsui Kogyo Co., MLS) and dried at 130° C. for 3 minutes, and dielectric-layer-formed copper foil provided with a thermosetting resin layer having a thickness of 5 µm in terms of dry thickness in what is called a B stage (semicured) state was obtained. The dielectric-film-formed copper foil thus obtained has a size of 500 mm in width×100 m (10000 cm) in length. In this embodiment, the first electrically conductive layer 3 and the second electrically conductive layer 5 have the same size.

On the other hand, an aromatic polyamide film having a thickness of 4 µm and a dielectric constant of 4.0 (made by Asahi Kasei Corporation, product name ARAMICA) was used as the dielectric film 6 and its two surfaces were subjected to corona discharge treatment and roughened thereby to improve the adhesive property. In this embodiment, the dielectric layer 4 must have a size which is larger by not less than 4 mm in full length and width than the metal foil webs of the first electrically conductive layer 3 and the second electrically conductive layer 5. Therefore, the dielectric film 6 used here had a size of 510 mm in width and 10000 cm in length.

As shown in FIG. 8, the resin surface of the dielectric-layer-formed copper foil which constitutes the second electrically conductive layer 5 was placed so as to face upward, the dielectric film 6 was superposed on this resin surface, and the dielectric-film-formed copper foil which becomes the first electrically conductive layer 3 was superposed on this dielectric film 6 so as to face downward. And they were continuously laminated in this state. At this time, the first electrically conductive layer 3 and the second electrically conductive layer 5 were disposed so as to be in a symmetric position via the dielectric layer 4, the end face position of the two electrically conductive layers 3, 5 on the start end side S and the terminal end side E was the same, and the dielectric layer film 6 positioned between the first electrically conductive layer 3 and the second electrically conductive layer 5 protruded by 5 mm from the two lateral end sides Sd1, Sd2 of the first electrically conductive layer 3 and the second electrically conductive layer 5. In the continuous laminating method adopted that time, in the range of 5 cm from the leading end portion of start of laminating, the application of a pressing pressure was avoided, whereby all interlayer parts of the first electrically conductive layer 3, the dielectric layer film 6 and the second electrically conductive layer 5 were brought into a separated state. Furthermore, also in the range of 2 cm before the completion of laminating, the application of a pressing pressure was avoided and all interlayer parts of the first electrically conductive layer 3, the dielectric layer film 6 and the second electrically conductive layer 5 were brought into a separated state, whereby the laminate web for capacitor layer 1g shown in FIGS. 7(A) and 7(C) was produced. In the laminating step, an atmosphere region permitting partial vacuum hot pressing was prepared and the laminate web for capacitor layer 1g was obtained by adding a quantity of heat corresponding to 165° C. for 60 minutes in the atmosphere.

By a method similar to that of the first embodiment a roll of laminate for capacitor layer for withstand voltage inspection was produced from the laminate web for capacitor layer 1g produced as described above and withstand voltage measurement was further carried out by a similar method. As a result, the withstand voltage measurement could be satisfactorily conducted without the occurrence of the short circuit phenomenon.

As described above by using a roll of carrier-foil-formed copper laminate for capacitor layer of printed wiring board related to the present invention, it becomes possible to perform quality assurance of a laminate web for capacitor layer along the full length and hence to supply a laminate web for capacitor layer to the market, which has thitherto been impossible. Moreover, the inspection for each sheet of laminate web for capacitor layer in cut sizes, which has thitherto been carried out, becomes unnecessary and it becomes possible to lower the quality control cost of laminates for capacitor layer. This results in a reduction in the total production cost of laminates for capacitor layer and enables highly reliable products to be supplied at lower prices.

What is claimed is:

1. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length than the size of the metal foil webs of the first electrically conductive layer and the second electrically conductive layer" and bonding these layers in a laminated state, the first electrically conductive layer and the second electrically conductive layer being disposed so as to be in a symmetric position via the dielectric layer, the end face position of the two electrically conductive layers on the start end side and the terminal end side being the same, and the dielectric layer positioned between the first electrically conductive layer and the second electrically conductive layer protruding by not less than 2 mm from the start end side and terminal end side of the first electrically conductive layer and the second electrically conductive layer, and wherein by providing interlayer dielectric means on one side of this laminate web for capacitor layer, an electrical insulation condition is formed between areas of the laminate web for capacitor layer which overlap each other when the laminate web for capacitor layer is wound in a roll state.

2. The roll of laminate for capacitor layer of printed wiring board for withstand voltage inspection according to claim 1, wherein the interlayer dielectric means is an insulating resin layer provided on one side of the laminate web for capacitor layer.

3. The roll of laminate for capacitor layer of printed wiring board for withstand voltage inspection according to claim 1, wherein the interlayer dielectric means is an insulating resin film superposed on one side of the laminate web for capacitor layer.

4. A method of withstand voltage inspection using the roll of laminate for capacitor layer of printed wiring board for withstand voltage inspection according to claim 1, comprising the steps of:

removing the interlayer dielectric means on the winding terminal side of the laminate web for capacitor layer positioned in the periphery of the roll of laminate web for withstand voltage inspection; and bringing a prode to the first electrically conductive layer and the second electrically conductive layer in this area and applying a voltage, whereby whether electrical conduction exists along the full length of the laminate web for capacitor layer is checked to make a pass/fail judgment.

5. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length and width than the size of the metal foil webs of the first electrically conductive layer and the second electrically conductive layer" and bonding these layers in a laminated state, the first electrically conductive layer and the second electrically conductive layer being disposed so as to be in a symmetric position via the dielectric layer, the end face position of the two electrically conductive layers on the start end side and the terminal end side being the same, and the dielectric layer positioned between the first electrically conductive layer and the second electrically conductive layer protruding by not less than 2 mm from peripheral ends of the first electrically conductive layer and the second electrically conductive layer, and wherein by providing interlayer dielectric means on one side of this laminate web for capacitor layer, an electrical insulation condition is formed between areas of the laminate web for capacitor layer which overlap each other when the laminate web for capacitor layer is wound in a roll state.

6. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the first electrically conductive layer having a prescribed size," "a metal foil web which forms the second electrically conductive layer having the same size as the first electrically conductive layer," and "a dielectric layer having a size which is longer by not less than 4 mm in full length and larger by not less than 2 mm in width than the size of the metal foil webs of the first electrically conductive layer and the second electrically conductive layer" and bonding these layers in a laminated state, the first electrically conductive layer being disposed with respect to the dielectric layer so that one lateral end side of the first electrically conductive layer coincides with one lateral end side of the dielectric layer and, at the same time, so that the dielectric layer protrudes by not less than 2 mm from the start end side and terminal end side of the first electrically conductive layer, and the second electrically conductive layer being disposed with respect to the dielectric layer so that one lateral end side of the second electrically conductive layer coincides with the other lateral end side of the dielectric layer and, at the same time, so that the dielectric layer protrudes by not less than 2 mm from the start end side and terminal end side of the second electrically conductive layer, and wherein by providing interlayer dielectric means on one side of this laminate web for capacitor layer, an electrical insulation condition is formed between areas of the laminate web for capacitor layer which overlap each other when the laminate web for capacitor layer is wound in a roll state.

7. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a dielectric layer having the same size as the metal foil web of the second electrically conductive layer" and "a metal foil web which forms the first electrically conductive layer having a size which is shorter by not less than 4 mm in length than the size of the metal foil web of the second electrically conductive layer," the second electrically conductive layer and the dielectric layer being disposed so that there is no displacement in width and length, and the first electrically conductive layer and the second electrically conductive layer being disposed via the dielectric layer so that a displacement of not less than 2 mm is produced on the start end side and terminal end side in the longitudinal direction, and wherein by providing interlayer dielectric means on one side of this laminate web for capacitor layer, an electrical insulation condition is formed between areas of the laminate web for capacitor layer which overlap each other when the laminate web for capacitor layer is wound in a roll state.

8. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a dielectric layer having the same size as the metal foil web of the second electrically conductive layer" and "a metal foil web which forms the first electrically conductive layer having a size which is smaller by not less than 4 mm in length and width than the size of the metal foil web of the second electrically conductive layer," the second electrically conductive layer and the dielectric layer being disposed so that positions of length and width on the start end side and terminal end side coincide with each other, the second electrically conductive layer and the dielectric layer being disposed so that the two lateral ends of the second electrically conductive layer and the dielectric protrude by not less than two mm from the two lateral ends of the first electrically conductive layer and so that the second electrically conductive layer and the dielectric layer protrude by not less than 2 mm from the start end side and terminal end side of the first electrically conductive layer in the longitudinal direction thereof, and wherein by providing interlayer dielectric means on one side of this laminate web for capacitor layer, an electrical insulation condition is formed between areas of the laminate web for capacitor layer which overlap each other when the laminate web for capacitor layer is wound in a roll state.

9. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a dielectric layer having the same size as the metal foil web of the second electrically conductive layer" and "a metal foil web which forms the first electrically conductive layer having the same size as the size of the metal foil web of the second electrically conductive layer," and bonding these layers, on the start end side and the terminal end side of the laminate for capacitor layer at least any one area selected from an interlayer part between the first electrically conductive layer and the dielectric layer, an interlayer part between the dielectric layer and the second electrically conductive layer and a part in the interior of the dielectric layer being in an unbonded state and forming a slit, and an interposed state being produced by inserting part of a splice tape in this slit part, wherein by providing interlayer dielectric means on one side of this laminate web for capacitor layer, an electrical insulation condition is formed between areas of the laminate web for capacitor layer which overlap each other when the laminate web for capacitor layer is wound in a roll state.

10. A roll of laminate for capacitor layer of printed wiring board for withstand voltage inspection, which is obtained by fabricating a laminate web for capacitor layer by sequentially laminating a first electrically conductive layer formed from a metal foil web, a dielectric layer and a second electrically conductive layer formed from a metal foil web and bonding these layers in a laminated state into one piece, splicing a start end side of the laminate web for capacitor layer to a core tube, and winding the laminate web for capacitor layer up to a terminal end side thereof, wherein the laminate web for capacitor layer to be spliced to the core tube and wound up thereby is fabricated by laminating "a metal foil web which forms the second electrically conductive layer having a prescribed size," "a first electrically conductive layer having the same size as the metal foil web of the second electrically conductive layer," and "a dielectric layer having a size which is larger by not less than 4 mm in with than the size of the metal foil webs of the first electrically conductive layer and the second electrically conductive layer" and bonding these layers, the first electrically conductive layer and the second electrically conductive layer being disposed so as to be in a symmetric position via the dielectric layer, the end face position of the two electrically conductive layers on the start end side and the terminal end side being the same, the dielectric layer positioned between the first electrically conductive layer and the second electrically conductive layer protruding by not less than 2 mm from the start end side and terminal end side of the first electrically conductive layer and the second electrically conductive layer, at least any one area selected from an interlayer part between the first electrically conductive layer and the dielectric layer, an interlayer part between the dielectric layer and the second electrically conductive layer and a part in the interior of the dielectric layer being in an unbonded state and forming a slit, and an interposed state being produced by inserting part of a splice tape in this slit part, and wherein by providing interlayer dielectric means on one side of this laminate web for capacitor layer, an electrical insulation condition is formed between areas of the laminate web for capacitor layer which overlap each other when the laminate web for capacitor layer is wound in a roll state.

* * * * *